United States Patent [19]
Paoli

[11] Patent Number: 6,002,142
[45] Date of Patent: *Dec. 14, 1999

[54] INTEGRATED OPTOELECTRONIC STRUCTURES INCORPORATING P-TYPE AND N-TYPE LAYER DISORDERED REGIONS

[75] Inventor: Thomas L. Paoli, Los Altos, Calif.

[73] Assignee: Xerox Corporation, Stamford, Conn.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/724,620

[22] Filed: Sep. 30, 1996

[51] Int. Cl.$^6$ ..................................................... H01L 29/06
[52] U.S. Cl. .............................. 257/21; 257/96; 257/184; 257/187; 257/290; 257/458; 257/462; 257/609
[58] Field of Search ................................. 257/15, 21, 88, 257/90, 94, 96, 97, 184, 187, 290, 458, 462, 609

[56] References Cited

U.S. PATENT DOCUMENTS

| | | |
|---|---|---|
| 4,824,798 | 4/1989 | Burnham et al. . |
| 4,837,607 | 6/1989 | Kemmer et al. . |
| 4,987,468 | 1/1991 | Thornton . |
| 5,013,684 | 5/1991 | Epler et al. . |
| 5,038,185 | 8/1991 | Thornton . |
| 5,062,115 | 10/1991 | Thornton . |
| 5,164,797 | 11/1992 | Thornton . |
| 5,231,298 | 7/1993 | Daly . |
| 5,283,447 | 2/1994 | Olbright et al. ........................... 257/85 |
| 5,317,586 | 5/1994 | Thornton et al. . |
| 5,455,429 | 10/1995 | Paoli et al. . |

OTHER PUBLICATIONS

"AlGaAs/GaAs Lateral Current Injection Multiquantum Well (LCI–MQW) Laser Using Impurity–Induced Disordering", Furuya et al., IEEE Journal Of Quantum Electronics, vol. 24, No. 12, Dec. 1988, pp. 2448–2453.

"The Diffusion of Silicon In Gallium Arsenide", G.R. Antell, Solid State Electronics, Pergamon Press 1965, vol. 8, pp. 943–946.

"Diffusion of Silicon in Gallium Arsenide Using Raped Thermal Processing: Experiment and Model", Greiner et al., Appl. Phys. Lett. 44 (8), Apr. 15, 1984, pp. 750–752.

"Disorder of an $Al_xGa_{1-x}As$–GaAs superlattice by doner diffusion" Meehan et al., Appl. Phys. Lett. 45(5), Sep. 1, 1984, pp. 549–551.

"Design of Fabry–Perot Surface–Emitting Lasers With a Periodic Gain Structure", Corzine et al., IEEE Journal of Quantum Electronics, vol. 25, No. 6, Jun. 1989, pp. 1513–1524.

"Fabrication of Low Threshold Voltage Microlasers", Scherer et al., Electronics Letters, Jun. 18, 1992, vol. 28, No. 13, pp. 1224–1226.

"Channeling Photodiode: A New Versatile Interdigitated p–n Junction Photodetector", Capasso et al., Appl. Phys. Lett. 41(10) Nov. 15, 1982, pp. 944–946.

"Doping (n–i–p–i) Superlattices", Dohler et al., Synthetic Modulated Structures, 1985, pp. 163–214.

*Primary Examiner*—Sara Crane
*Attorney, Agent, or Firm*—Oliff & Berridge, PLC

[57] ABSTRACT

Novel semiconductor devices are monolithically defined with p-type and/or n-type wide bandgap material formed by impurity induced layer disordering of selected regions of multiple semiconductor layers. The devices are beneficially fabricated by simultaneously forming the n-type and/or p-type layer disordered regions with sufficiently abrupt transitions from disordered to ordered material. The novel devices include laterally and vertically oriented P-i-N or N-i-P photodetectors integrated with laterally oriented P-N-P or N-P-N bipolar transistors, respectively, an N-P-N or P-N-P bipolar transistor monolithically integrated with an edge emitting semiconductor laser, and laterally and vertically oriented P-i-N or N-i-P photodetectors integrated with the monolithically integrated bipolar transistor and edge emitting semiconductor laser.

15 Claims, 20 Drawing Sheets

INTEGRATED OPTOELECTRONIC STRUCTURES INCORPORATING P-TYPE AND N-TYPE LAYER DISORDERED REGIONS

BACKGROUND OF THE INVENTION

1. Field of the Invention

This invention relates to novel semiconductor devices and structures which incorporate p-type and n-type layer disordering of multiple semiconductor layers. U.S. Pat. No. 5,376,583 to Northrup and Paoli, which discloses a method for making p-type disordered materials alone or simultaneously with n-type disordered materials, is incorporated herein by reference.

In particular, the invention relates to a number of overlapping integrated structures, including: diode lasers; N-i-P and P-i-N detectors; and N-P-N and P-N-P bipolar transistors; and N-P-N and P-N-P bipolar phototransistors.

2. Description of Related Art

Impurity-induced layer disordering of a plurality of layers in semiconductors is an important step in fabricating optoelectronic devices, such as lasers, transistors and photodiodes. The diffusion of silicon into multiple layers of semiconductors under conditions, such as Group V-rich conditions, forms layer disordered material. However, such impurity induced layer disordering with silicon was limited to forming an n-type material. In addition, while diffusion of zinc into multiple layers of Group III–V semiconductors forms p-type layer disordered material, such semiconductor materials were not suitable for use in many devices, because zinc diffused materials lack an abrupt and reproducible transition from ordered to disordered material.

Accordingly, most known devices requiring both p-type and n-type doped materials formed by impurity induced layer disordering could not be usefully manufactured. Further, known devices have not provided integrated structures with planar surfaces with interconnections that are built into the device. These known devices require substantial etching and/or additional manufacturing steps, making it very difficult to form a variety of different devices integrated on the same layer configuration. Further, these devices are not laterally configured allowing combinations of two or more elements to be used to form complicated integrated circuits.

SUMMARY OF THE INVENTION

This invention provides for integrated optoelectronic structures incorporating n-type and p-type layer disordered regions, where interconnections between the devices in the integrated optoelectronic structures are built into the integrated optoelectronic structures.

This invention further provides for integrated optoelectronic structures incorporating n-type and p-type layer disordered regions, which require little or no etching.

This invention also provides for an integrated optoelectronic structure incorporating n-type and p-type layered disordered regions, wherein a large variety of device shapes and/or sizes can be incorporated into the integrated optoelectronic structure.

This invention also provides for an integrated optoelectronic structure incorporating n-type and p-type layered disordered regions, with a variety of different regions integrated on the same layer configuration of the integrated optoelectronic structure.

This invention additionally provides for an integrated optoelectronic structure incorporating n-type and p-type layered disordered regions, wherein the integrated optoelectronic structure permits combinations of two or more elements, which are used in the development of complicated circuitry.

This invention specifically provides for integrated optoelectronic structures incorporating n-type and p-type layer disordered regions, comprising a heterojunction bipolar transistor wherein all operational contacts are beneficially on a planar surface of the structure.

Other devices and advantages, together with the full understanding of the invention, will become apparent and appreciated by referring to the following description and claims taken in conjunction with the accompanying drawings.

BRIEF DESCRIPTION OF THE DRAWINGS

The invention is described in relation to the following drawings, in which like reference numbers refer to like elements, wherein.

DETAILED DESCRIPTION OF THE PREFERRED EMBODIMENTS

When silicon is used as a dopant in arsenic-rich GaAs or AlGaAs, silicon preferably occupies gallium sites. Therefore, silicon acts as an electron donor. Silicon is believed to diffuse by forming a mobile complex with a gallium vacancy. Accordingly, impurity-induced layer disordering (IILD) of multiple layers of GaAs and AlGaAs, for example, by diffusion of silicon under arsenic-rich conditions, produces only n-type wide bandgap material.

Conversely, silicon, when used as a dopant in gallium-rich conditions, preferably occupies arsenic sites. Thus, silicon acts as an electron acceptor. Silicon can be used, in conjunction with gallium-rich annealing conditions or in a gallium-rich source layer, to obtain p-type impurity-induced layer disordering of multiple layers of GaAs and AlGaAs, because silicon diffuses under gallium-rich conditions by forming a complex with a gallium interstitial.

The formation of p-type and n-type regions with silicon is especially beneficial because of the abrupt transition between disordered and non-disordered regions produced by the silicon diffusion front. The abruptness of this transition enables novel semiconductor structures to be formed from selected regions of n-type and p-type wide bandgap material produced by impurity induced layer disordering within a multiple layer semiconductor structure. Furthermore, such device structures are beneficially made by simultaneously forming the n-type and p-type IILD regions. Simultaneously forming the n-type and p-type IILD regions eliminates further annealing steps. Additional annealing steps can cause depth changes and changes in the shape of a disordered region produced by a prior annealing step. Simultaneously forming the n-type and p-type IILD regions is achieved by controllably adding Group III and/or Group V dopants to the silicon layer and/or by controlling the ambient environment during annealing, as described in U.S. Pat. No. 5,376,583.

Monolithic integrated combinations of single electro-optical devices permit a plurality of devices to share common lateral regions and/or buried layers. The integrated structures include monolithic combinations of P-i-N or N-i-P detectors, heterojunction bipolar N-P-N or P-N-P transistors, and/or diode lasers.

These integrated structures have planar surfaces and require little or no etching. Connections between the devices are incorporated into the integrated structures so a large variety of devices and shapes can be formed within the integrated structure. Furthermore, different devices can be integrated within the same layer configuration. The integrated structures allow combinations of two or more elements to be used as building blocks to form complicated electronic circuits.

Figure 1A:
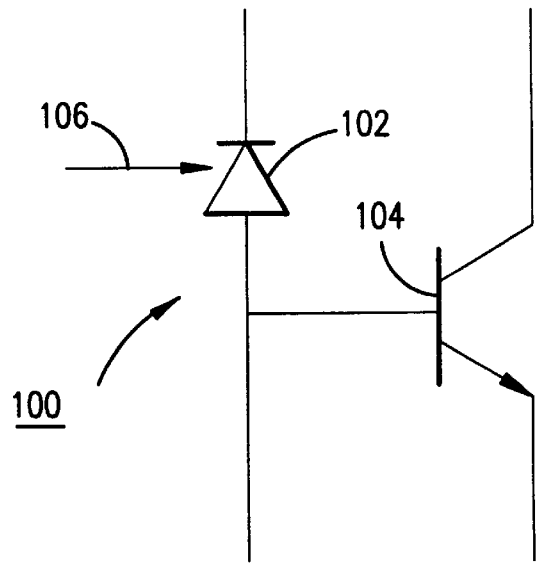
FIG. 1A is a circuit diagram for an N-i-P detector integrated with an N-P-N transistor.
Figure 1B:
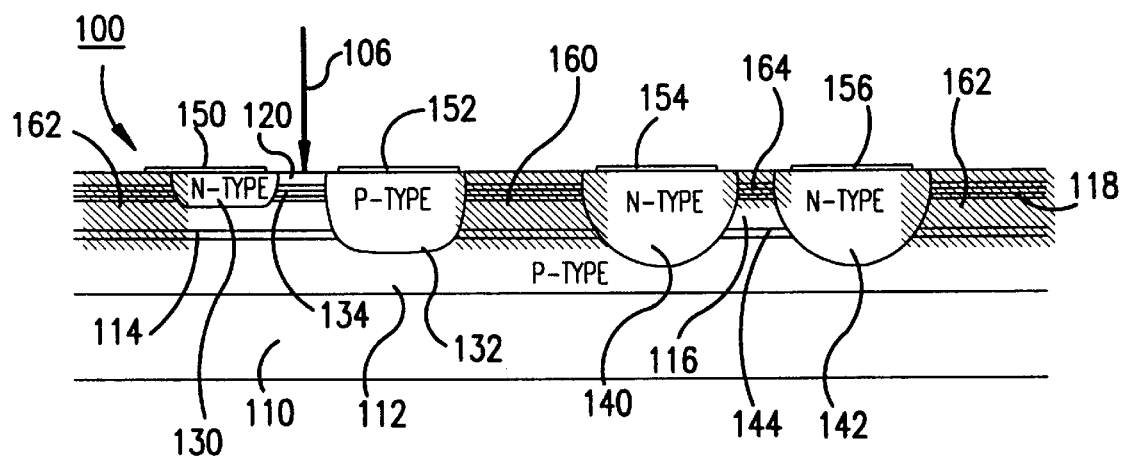
FIG. 1B is a cross-sectional view of a linear lateral N-i-P detector and N-P-N transistor.

FIG. 1A is a circuit diagram of an integrated semiconductor device 100 comprising an N-i-P detector 102 integrated with a N-P-N transistor 104. As shown in FIG. 1A, light 106 illuminates the N-i-P detector 102. FIG. 1B is a side sectional view of the integrated semiconductor device 100 including the linear laterally oriented N-i-P detector 102 and the linear laterally oriented N-P-N transistor 104.

The integrated semiconductor device 100 is formed in a section of a semiconductor chip and specifically includes a semi-insulating substrate 110, which is preferably formed of GaAs. A first cladding layer 112 is formed over the semi-insulating substrate 110. The first cladding layer 112 is preferably formed of p-$Ga_{1-x}Al_xAs$ and is preferably formed by epitaxial deposition. A buried p-type layer 114 is formed over the first cladding layer 112. A p-type or undoped spacer layer 116 is formed over the buried p-type layer 114.

An active multilayer stratum 118 is formed over the spacer layer 116. The active multilayer stratum 118 includes alternating layers of high bandgap and low band gap material. The active multilayer stratum 118 preferably includes relatively thin conventional double heterostructure active layers, such as those disclosed in U.S. Pat. No. 5,455,429, fully incorporated herein by reference. Thus, a more detailed description of the active multilayer stratum 118 is omitted. However, it should be appreciated that the low band gap material must have a band gap which is below the energy of the light wavelength(s) to which the N-i-P detector 102 is tuned.

The second cladding layer 120, which is also formed of p-type or undoped $Ga_{1-x}Al_xAs$, is formed over the active multilayer stratum 118. It should also be appreciated that the second cladding layer 120 must be transparent to the wavelength(s) of light to which the N-i-P detector 102 is tuned, so that the light can reach the active multilayer stratum 118. All of the layers 112–120 may be deposited by well known techniques, such as metal organic vapor deposition or molecular beam epitaxy.

The laterally oriented N-i-P detector 102 and the N-P-N transistor 104 are formed in at least the second cladding layer 120 and the active multilayer stratum 118. Specifically, the N-i-P detector 102 includes an n-type disordered region 130, a p-type disordered region 132, and an undisordered portion 134. The n-type region 130 is preferably formed by diffusing silicon in an arsenic-rich (or more generally, a Group V-rich) environment into the second cladding layer 120. The n-type region 130 preferably extends through the second cladding layer 120 and the active multilayer stratum 118 and into the spacer layer 116.

Similarly, the p-type region 132 is preferably formed by diffusing silicon in a gallium-rich (or more generally, a group III-rich) environment into the second cladding layer 120. The p-type region 132 preferably extends through the second cladding layer 120, the active multilayer stratum 118, the spacer layer 116 and the buried p-type layer 114 and into the first cladding layer 112. The undisordered portion of the active multilayer stratum 118 located between the n-type region 130 and the p-type region 132 forms the undoped or intrinsic (or "i") region 134 of the N-i-P detector 102.

The N-P-N transistor 104 includes an n-type disordered region 140 forming the emitter of the transistor 104, an n-type disordered region 142 forming the collector of the transistor 104, and a base channel 144. The n-type regions 140 and 142 are preferably formed by diffusing silicon in an arsenic-rich environment. The n-type regions 140 and 142 each preferably extend through the first cladding layer 120, the active multilayer stratum 118, the spacer layer 116 and the buried p-type region 114 into the first cladding layer 112. The base channel 144 is formed by the undisordered portion of the buried p-type layer 114 located between the n-type regions 140 and 142.

One or more of the various regions of the N-i-P detector 102 and the N-P-N transistor 104 should have an energy bandgap which is larger than at least the smallest energy bandgap of the material forming the active multilayer stratum 118. In other words, the bandgap of the lowest bandgap material of the active multilayer stratum 118 must be smaller than the bandgap of one or more of the n-type regions 130, 140 and 142 and the p-type region 132.

A conductive detector cathode contact 150 and a conductive detector anode contact 152 are formed over the second cladding layer 120. The detector contacts 150 and 152 extend vertically over the n-type region 130 and the p-type region 132, respectively. Similarly, a conductive emitter contact 154 and a conductive collector contact 156 are formed over the second cladding layer 120. The transistor contacts 154 and 156 extend vertically over the n-type regions 140 and 142, respectively. The contacts 150, 152, 154 and 156 are preferably formed of metal, such as combination of chromium and gold, although they could be formed by any known conductive material.

A first proton bombardment region 160 extends between the p-type region 132 and n-type region 140. The first proton bombardment region 160 isolates the N-i-P detector 102 from the N-P-N transistor 104. Second proton bombardment regions 162 are formed on the outside sides of the n-type regions 130 and 142. The second proton bombardment regions 162 isolate the semiconductor device 100 from adjacent semiconductor devices 100 formed in the same semiconductor chip or from the edges of the chip. The first and second proton bombardment regions 160 and 162 extend through the first cladding layer 120, the active multilayer stratum 118, the spacer layer 116 and the buried p-type layer 114 and into the first cladding layer 112. A third proton bombardment region 164 is formed between the n-type regions 140 and 142. The third proton bombardment region 164 extends through the second cladding layer 120 and the active multilayer stratum 118 and into the spacer layer 116. The third proton bombardment region 164 deactivates the multilayer stratum 118 in the N-P-N transistor 104.

When light 106 of the wavelengths to which the active multilayer stratum layer 118 is tuned impinges on the N-i-P detector 102, the incident light 106 generates charge carriers in the i region 134. This causes current to flow between the n-type region 130 and the p-type region 132. This, in turn, supplies current to the base channel 144 of the N-P-N transistor 104. This current turns on the N-P-N transistor 104, allowing current to flow between the n-type regions 140 and 142.

As discussed in U.S. Pat. No. 5,455,429, after the layers 110–120 are formed in the device 100, a silicon nitride mask layer is deposited on the second cladding layer 120. Windows are opened in the silicon nitride mask layer. An arsenic-rich silicon layer is deposited through the windows over the second cladding layer 120 where the n-type disordered regions 140 and 142 will be formed. After the arsenic-rich silicon layer is capped with silicon nitride layer other windows in the silicon nitride mask layer are opened to the second cladding layer 120 where the p-type disordered region 132 will be formed. A gallium-rich layer is deposited through these windows and then capped with a silicon nitride layer. Next, the heterostructure is annealed at a high temperature to partially form the disordered regions 132,140 and 142. After the silicon has partially diffused in regions 132,140, and 142, the annealing is stopped, a window is opened in the silicon nitride mask layer above where the n-type disordered region 130 will be formed. An arsenic-rich silicon layer is deposited over the second cladding layer 120 through this window. The arsenic-rich silicon layer is then capped with a silicon nitride cap layer and the annealing is resumed to form the disordered region 130 and complete the formation of the disordered regions 132, 140 and 142. Simultaneously forming the n-type and p-type regions 130, 132, 140 and 142 allows several types of novel devices to be formed in one integrated device. That device can include a monolithically integrated combination of separate optoelectronic devices.

By annealing the semiconductor device 100, silicon atoms in the arsenic-rich and gallium-rich silicon layers diffuse to form the impurity induced layer disordered regions 130, 132, 140 and 142. Due to the gallium-rich silicon layer, the silicon diffuses in what is effectively a gallium-rich environment. Thus, the layer intermixing produced by this diffusion forms the p-type layer disordered region 132. Due to the arsenicrich silicon layer, the silicon diffuses in what is effectively an arsenic-rich environment. The layer intermixing produced by this diffusion forms the n-type layer disordered regions 130, 140, and 142.

In an alternate method for forming the integrated device 100, the above procedure is followed until the annealing is stopped after the partial formation of the disordered regions 132, 140, and 142. A window is then opened in the silicon nitride mask layer above where the n-type disordered region 130 will be formed. An undoped silicon layer, rather than an arsenic-rich silicon layer, is deposited through the window over the second cladding layer 120. The undoped silicon layer is left exposed and the annealing is resumed in an arsenic-rich environment to form the shallow disordered region 130 and complete the formation of the deep disordered regions 132, 140 and 142.

By annealing the semiconductor device 100 in an arsenic-rich environment with the undoped silicon layer exposed, the exposed silicon diffuses into the semiconductor device 100 to form the shallow n-type regions while diffusion of the capped, doped silicon into the semiconductor device 100 will form the deep n-type and the p-type regions.

Figure 2A:
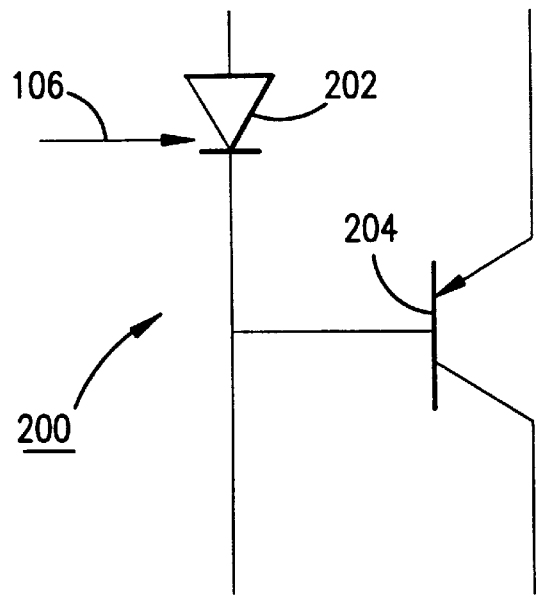
FIG. 2A is a circuit diagram for a P-i-N detector integrated with a P-N-P transistor.
Figure 2B:
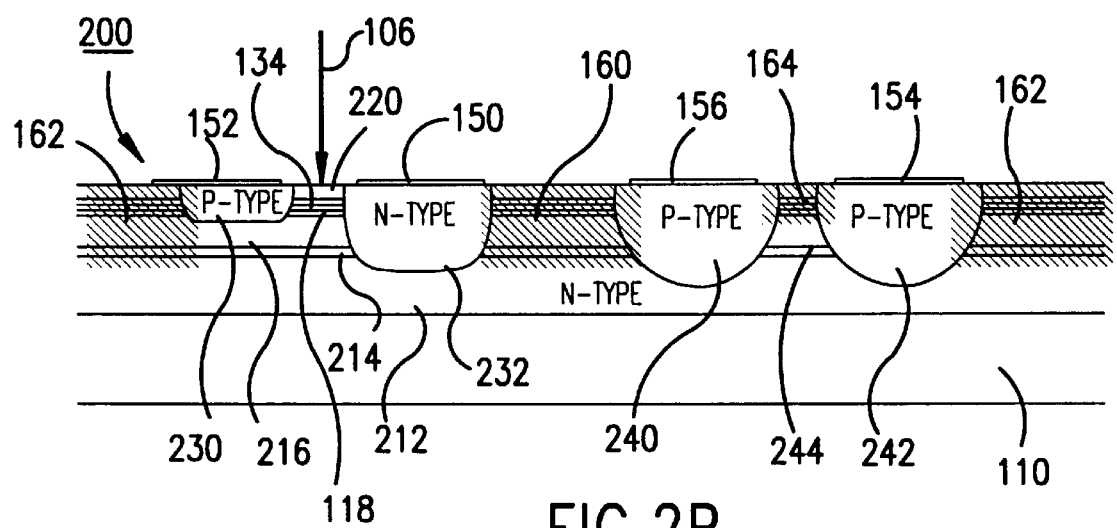
FIG. 2B is a cross-sectional view of a linear lateral P-i-N detector and a P-N-P transistor.

FIG. 2A is a circuit diagram of a second semiconductor device 200 comprising a P-i-N detector 202 and a P-N-P bipolar transistor 204. FIG. 2B shows a side sectional view of the semiconductor device 200 corresponding to the circuit diagram shown in FIG. 2A.

In general, the second semiconductor device 200 shown in FIG. 2B is identical to the first semiconductor device 100 shown in FIG. 1B, except that the dopant types for the layers 112, 114, 116 and 120, and thus the types of the impurity induced layer disordered regions 130, 132, 140 and 142, have been reversed in the layers 212, 214, 216 and 220 and in the impurity induced layer disordered regions 230, 232, 240 and 242.

Thus, the p-type region 230 forms the anode of the P-i-N detector 204, while the n-type region 232 forms the cathode of the P-i-N detector 202. Similarly, the p-type region 240 forms the emitter of the P-N-P transistor 204, while the p-type region 242 forms the collector of the P-N-P transistor 204. Likewise, the base channel 244 is formed from the portion of the buried n-type layer 214 located between the p-type regions 240 and 242. In all other respects, the semiconductor device 200 shown in FIG. 2B is identical in structure and operation to the semiconductor 100 shown in FIG. 1B.

Figure 3A:
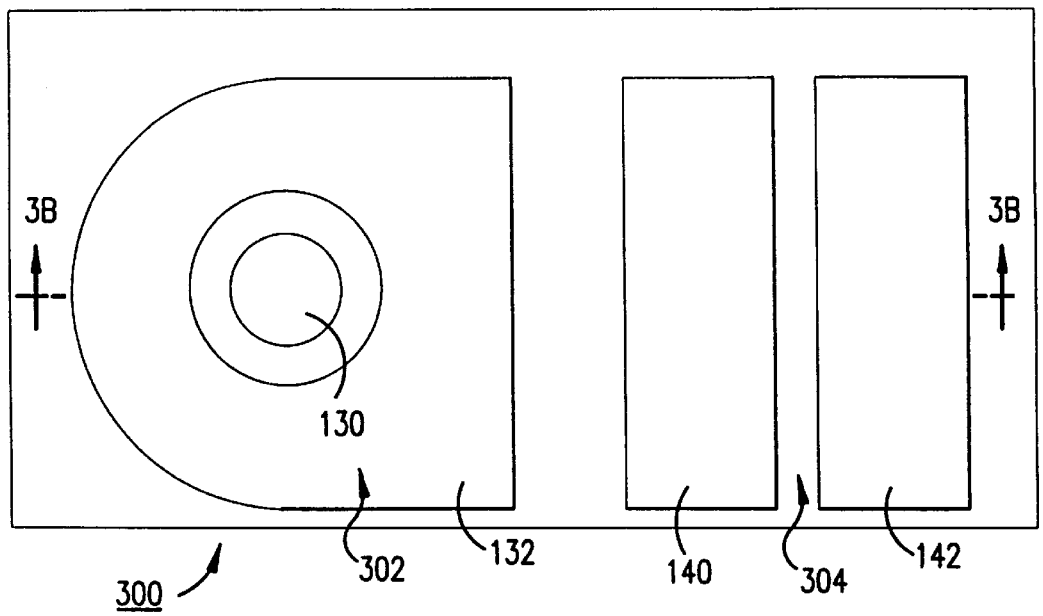
FIG. 3A is a top plan view of an N-i-P detector integrated with an N-P-N transistor using a circular laterally oriented detector and a linear transistor.
Figure 3B:
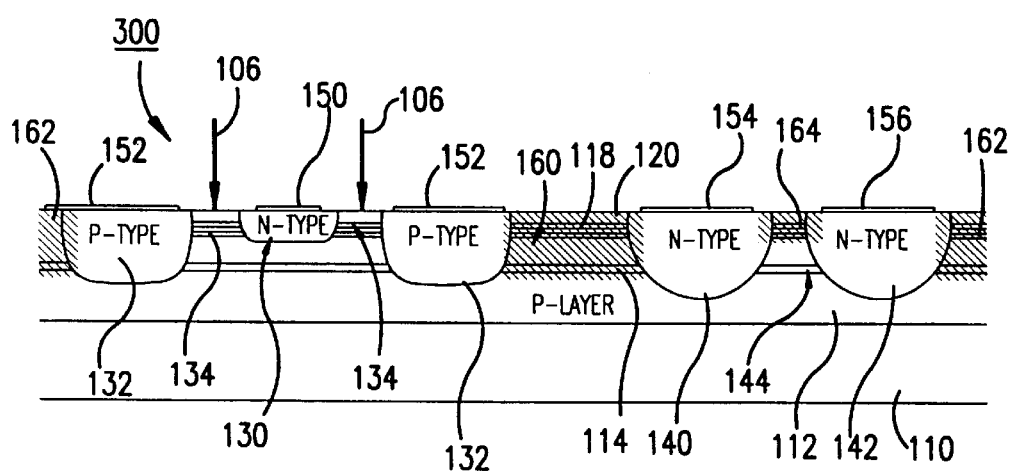
FIG. 3B is a cross-sectional view of the semiconductor device of FIG. 3A.

FIGS. 3A and 3B show a top plan view and a side sectional view of a third semiconductor device 300. In general, the third semiconductor device 300 is identical to the first semiconductor device 100 shown in FIG. 1B. The third semiconductor device 300 differs from the first semiconductor device 100 only in that the cathode and the anode regions 130 and 132 of the third semiconductor device 300 are circularly oriented, rather than linearly oriented as in the first semiconductor device 100. Thus, as shown in FIG. 3A, the n-type cathode region 130 is surrounded by the p-type anode region 132. This can also be seen in the side sectional view shown in FIG. 3B, where the P-type region 132 exists on both sides of the n-type region 130. Similarly, the i region 134 is present on both sides of the n-type cathode region 130. It should be appreciated that, in all other respects, the third semiconductor device 300 shown in FIGS. 3A and 3B is identical in structure and operation to the first semiconductor device shown in FIG. 1B.

Figure 4A:
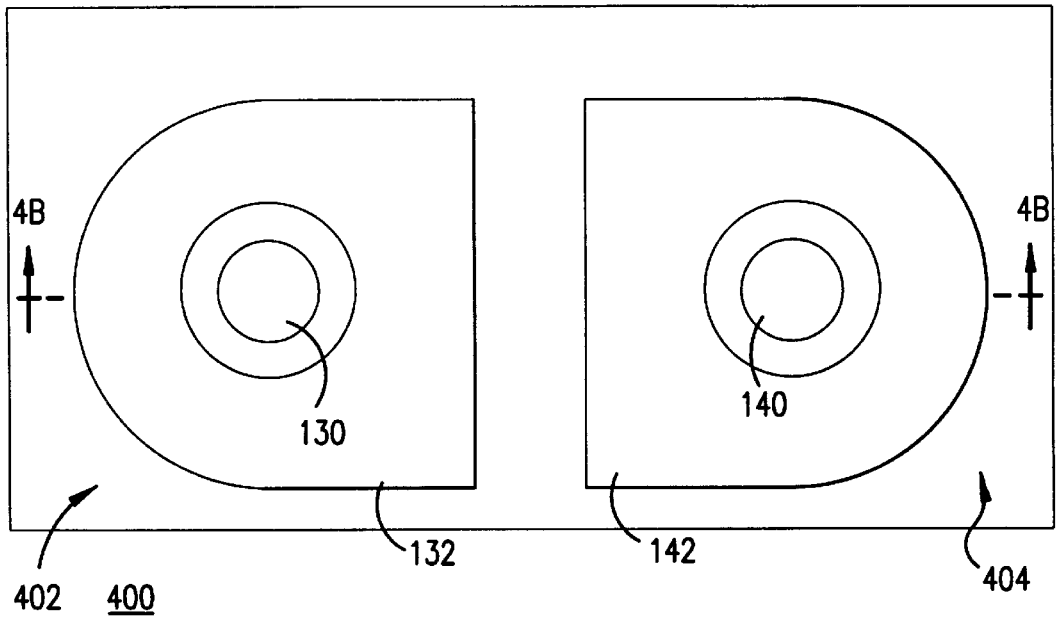
FIG. 4A is a top plan view of a circular laterally oriented detector and a circular transistor.
Figure 4B:
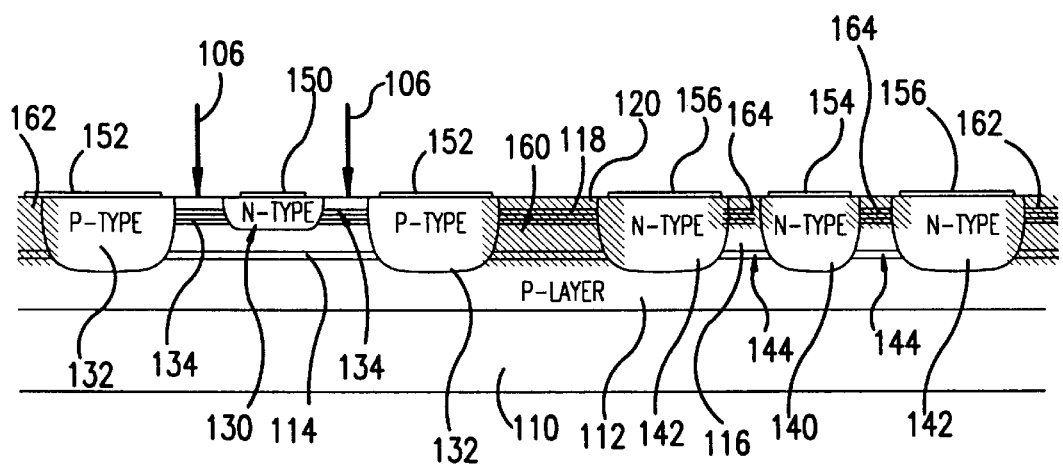
FIG. 4B is a cross-sectional view of the semiconductor device of FIG. 4A.

FIGS. 4A and 4B show a top plan view and a side sectional view of a fourth semiconductor device 400. In general, the fourth semiconductor device 400 is identical to the third semiconductor device 300 shown in FIGS. 3A and 3B. The fourth semiconductor device 400 differs from the third semiconductor device 300 only in that the emitter and collector regions 140 and 142 are also circularly oriented, rather than linearly oriented as in the first semiconductor device 100 and the third semiconductor device 300.

Thus, as shown in FIG. 4A, the n-type emitter region 140 is surrounded by the n-type collector region 142. This can also be seen in the side sectional view shown in FIG. 4B, where the n-type region 142 exists on both sides of the n-type region 140. Similarly, the p-type base channel region 144 exists on both sides of the n-type emitter region 140. It should also be appreciated that, in all other respects, the fourth semiconductor device 400 shown in FIGS. 4A and 4B is identical in structure and operation to the first and third semiconductor devices shown in FIGS. 1B, 3A and 3B.

Figure 5A:
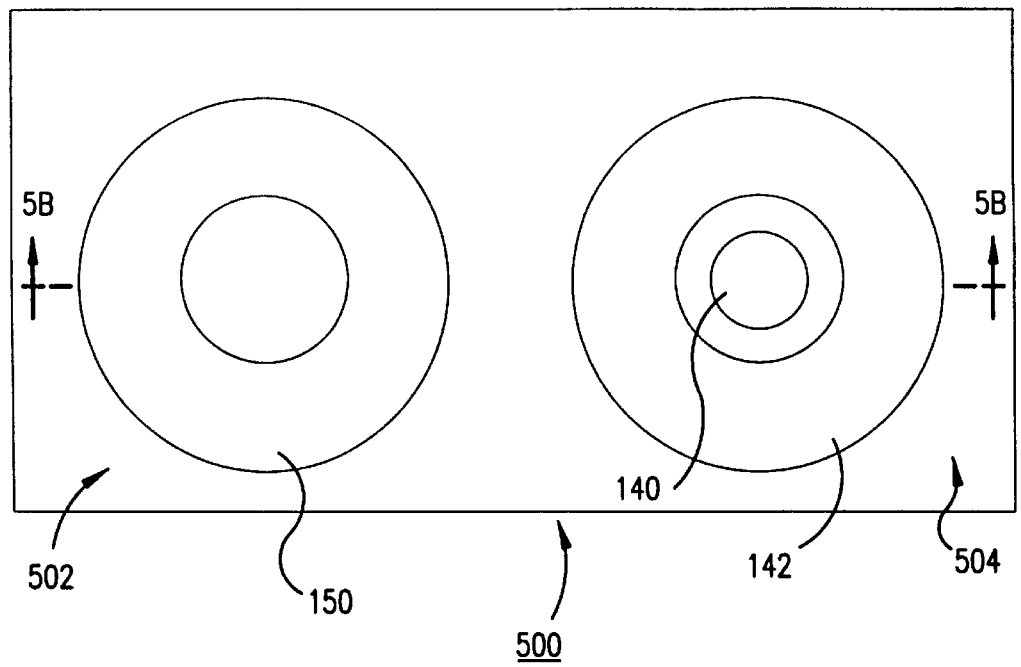
FIG. 5A is a top plan view of a circular vertically oriented detector and a circular transistor with a substrate contact.
Figure 5B:
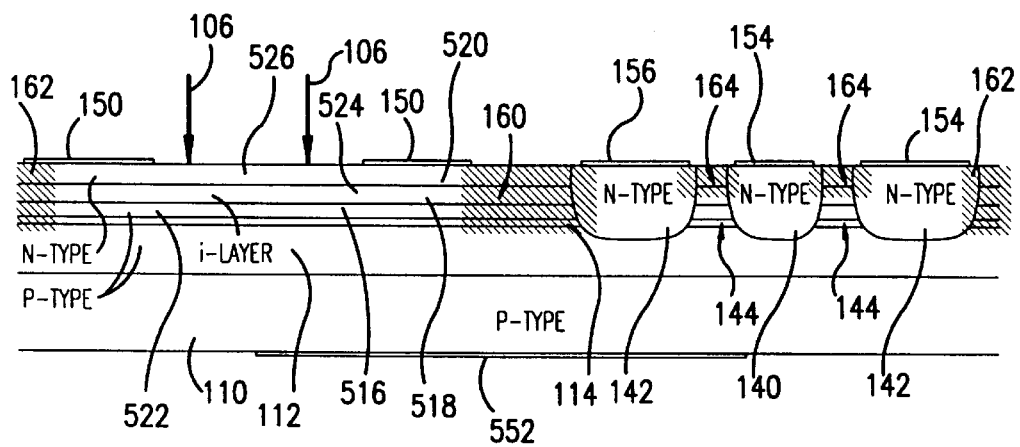
FIG. 5B is a cross-sectional view of the semiconductor device of FIG. 5A.

FIGS. 5A and 5B are a top plan view and a side sectional view of a fifth semiconductor device 500. The fifth semiconductor device 500 includes a circular vertically oriented N-i-P detector 502 and circular laterally oriented N-P-N transistor 504.

The fifth semiconductor device 500 includes a p-type substrate 110. A p-type first cladding layer 112 is formed over the p-type substrate 110. A p-type buried layer 114 is formed over p-type first cladding layer 112. A p-type detector anode layer 516 is formed over the buried p-type layer 114. A detector insulating layer (i.e., i layer) 518 is formed over the detector anode layer 516. An n-type detector cathode layer 520 is formed over the detector i layer 518.

As shown in FIG. 5B, the N-i-P detector 502 is vertically oriented, rather than being laterally oriented as in the semiconductor devices 100–400. Accordingly, the n-type cathode layer 520 must be transparent to the wavelength(s) of light to which the i layer 518 is tuned. Furthermore, as shown in FIG. 5B, the i layer 518 is formed from a single low-bandgap material, which must have a bandgap which is lower than the energy of the wavelength(s) of light to which the N-i-P detector 502 is tuned. This layer 518 is used in place of the active multilayer stratum 118 used in the semiconductor devices 100–400. It should be appreciated that the single material i layer 518 and the multi-material active multilayer stratum 118 are interchangeable.

The N-i-P detector 502 is formed by an N-type region 526, and i-region 524 and a P-type region 522. The N-type region 526 is formed in the N-type layer 520 between the proton bombardment region 160 and one of the proton bombardment regions 162. Similarly, the i-region 524 and the P-type region 522 are formed in the i layer 518 and the p-type layer 516, respectively, between the proton bombardment region 160 and the one of the proton bombardment regions 162.

Finally, as shown in FIG. 5B, the semiconductor 500 has a conductive contact 552 formed over the surface of the p-type substrate 110 on the side opposite to which the first cladding layer 112 is formed. The conductive contact 552 forms a combined detector anode and transistor base contact for contacting the P-region 522 of the N-i-P detector 502 and for electrically contacting the base channel regions 144 of the N-P-N transistor 504.

Figure 6A:
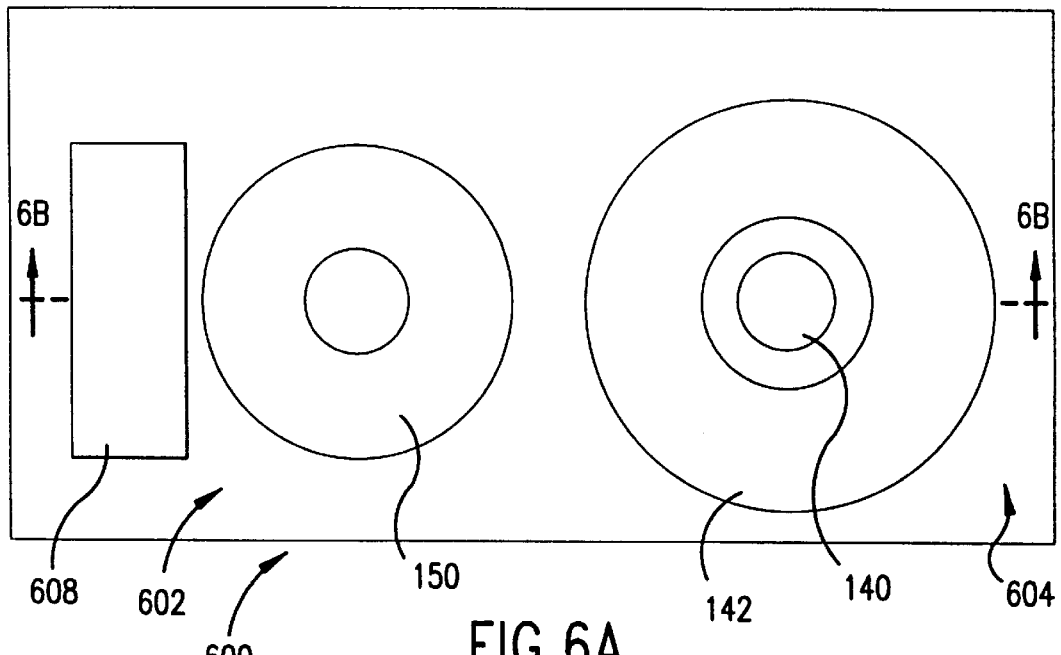
FIG. 6A is a top plan view of a circular N-i-P vertically oriented detector and a circular N-P-N transistor having a remote detector cathode/transistor base contact.
Figure 6B:
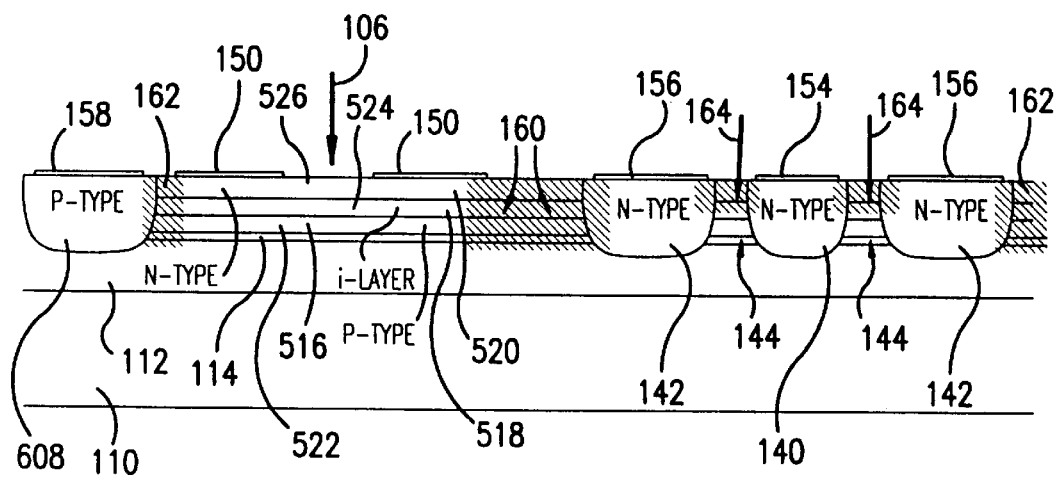
FIG. 6B is a cross-sectional view of the semiconductor device of FIG. 6A.

FIGS. 6A and 6B show a sixth semiconductor device 600 including a circular vertically oriented N-i-P detector 602 and a circular laterally oriented N-P-N transistor 604 having a remote p-type detector cathode/transistor base region 608.

The circular vertically oriented N-i-P detector 602 and the circular laterally oriented transistor 604 are generally identical to the circular vertically oriented N-i-P detector 502 and the circular laterally oriented N-P-N transistor 504 shown in FIGS. 5A and 5B. The sixth semiconductor device 600 differs from the fifth semiconductor device 500 only in that the detector anode and transistor base contact 552 is replaced by the p-type region 608 formed on the far side of the one of the proton bombardment regions 162 formed next to the N-i-P detector 602. In addition, a conductive detector anode contact 158 is formed over the p-type region 608. The conductive contact 158 and the p-type region 608 provide an anode contact for contacting the anode region 522 of the N-i-P detector 602. The p-type region 608 is formed in the n-type region 520 and extends through the i layer 518, the p-type layer 516, the buried p-type region 114 and into the first cladding layer 112. Since all contacts to semiconductor devices 600 are made from the top side of the structure, the substrate can be n-type or semi-insulating.

Figure 7A:
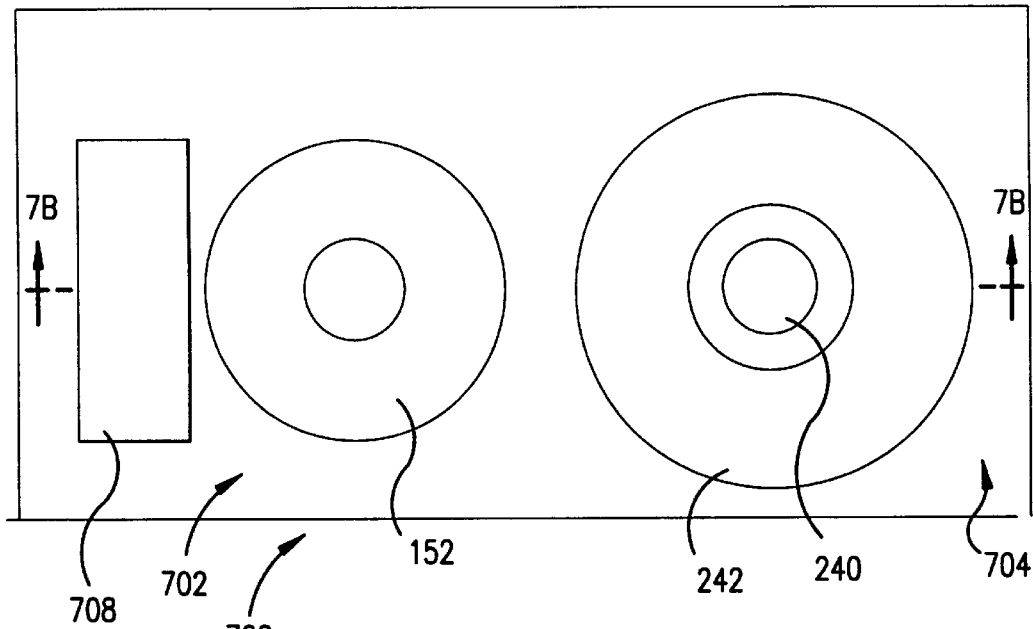
FIG. 7A is a top plan view of circular vertically oriented P-i-N detector and a circular P-N-P transistor having a remote detector cathode/transistor contact.
Figure 7B:
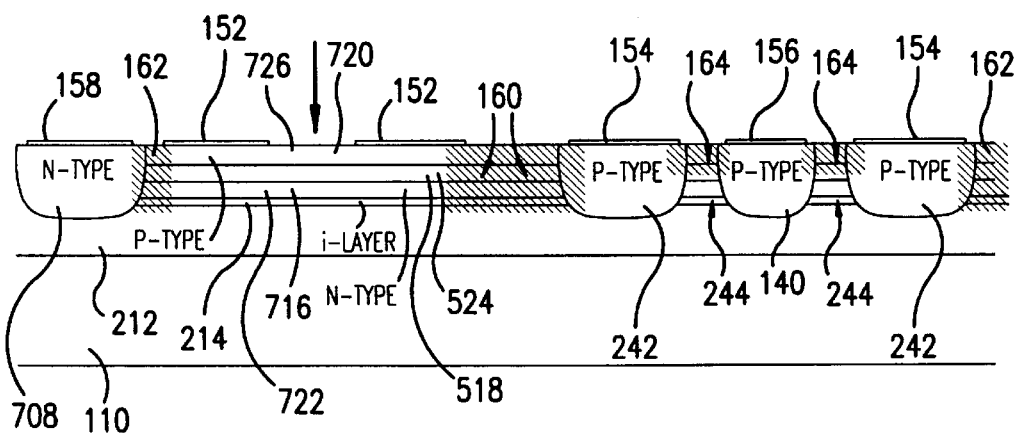
FIG. 7B is a cross-sectional view of the semiconductor device of FIG. 7A.

FIG. 7A is a top plan view of a seventh semiconductor device 700 including a circular vertically oriented P-i-N detector 702 and a circular laterally oriented P-N-P bipolar transistor 204. FIG. 7B shows a side sectional view of the semiconductor device 700.

In general, the seventh semiconductor device 700 shown in FIG. 7B is identical to the sixth semiconductor device 600 shown in FIG. 6B, except that the dopant types for the layers 112, 114, 516 and 520 have been reversed in the layers 212, 214, 716 and 720. Similarly, the dopant types for the impurity induced layer disordered regions 140, 142 and 608 have been reversed in the impurity induced layer disordered regions 240, 242 and 708.

Thus, the p-type region 240 forms the emitter of the P-N-P transistor 704 while the p-type region 242 forms the collector of the P-N-P transistor 704. Likewise, the base channel 244 is formed by the portions of the undisordered n-type layer 214 located between the p-type regions 240 and 242. Similarly, the n-type region 708 forms an n-type cathode contacting region, while the conductive contact 158 forms a conductive detector cathode contact.

In the same manner, the portion of the p-type layer 720 between the proton bombardment region 160 and one of the proton bombardment regions 162 forms the anode region 726 of the P-i-N detector 702, while the portion of the n-type layer 716 between the proton bombardment regions 160 and 162 forms the cathode region 722 of the P-i-N detector 702. In all other respects, the seventh semiconductor device 700 shown in FIGS. 7A and 7B is identical in structure and operation to the sixth semiconductor device 600 shown in FIGS. 6A and 6B.

Furthermore, it should be appreciated that any of the semiconductor devices 300–500 shown in FIGS. 3A–5B can also have the dopant types of each of their doped regions and their diffusion regions reversed from that described, similarly to the reversal of dopant types shown in FIGS. 2B, 7A and 7B from the dopant types shown in FIGS. 1B, 6A and 6B.

Figure 8A:
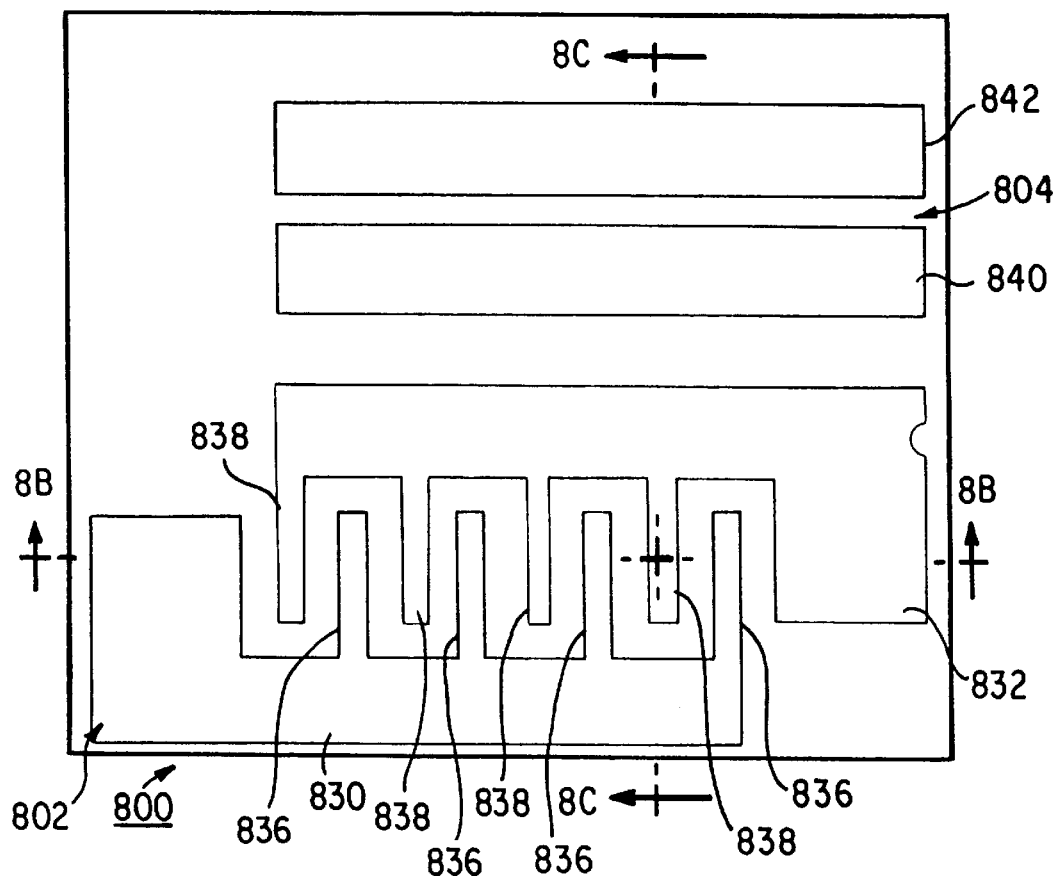
FIG. 8A is a top plan view of an interdigitated semiconductor device formed according to the principles of this invention.
Figure 8B:
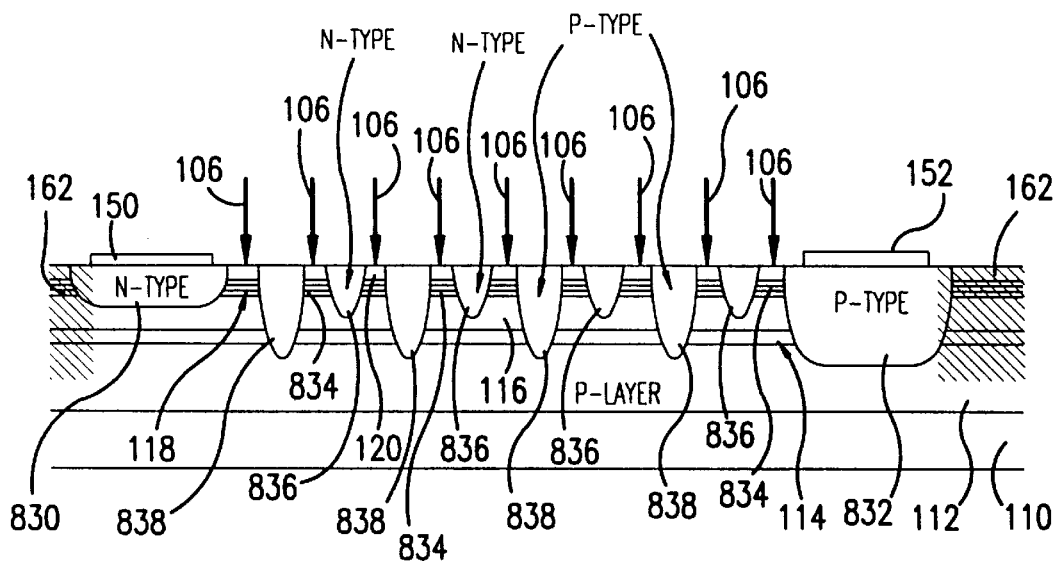
FIG. 8B is a cross-sectional view of the semiconductor device of FIG. 8A.
Figure 8C:
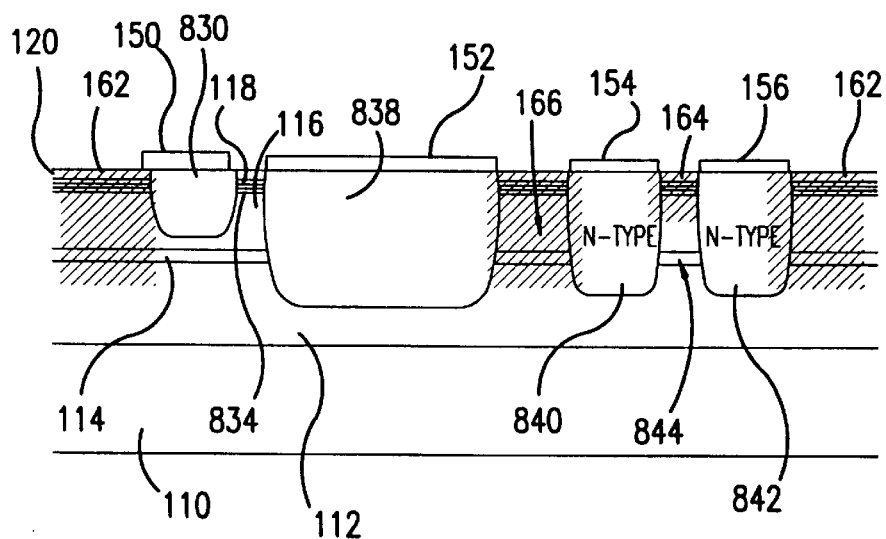
FIG. 8C is a second cross-sectional view of the semiconductor device of FIG. 8A.

FIGS. 8A–8C show a top plan view and two side sectional views of an eighth semiconductor device 800. In particular, the sectional views of FIGS. 8B and 8C are sectional cuts oriented at 90°to each other.

As shown in FIGS. 8A–8C, the eighth semiconductor device 800 comprises an interdigitated linear laterally oriented N-i-P detector 802 and a linear laterally oriented N-P-N transistor 804. The interdigitated N-i-P detector 802 comprises an n-type cathode region 830 and a p-type anode region 832. A plurality of n-type cathode finger regions 836 extend from the cathode region 830. Similarly, a plurality of p-type anode finger regions 838 extend from the anode region 832. In particular, along the section line 8B, the detector cathode region 830 and the cathode finger regions 836 alternate with the detector anode region 832 and the anode finger regions 838. The N-P-N transistor 804 comprises an n-type emitter region 840 and an n-type collector region 842.

As shown in FIG. 8B, a primary n-type cathode region 830 and a primary p-type anode region 832 are formed at the far lateral ends of the interdigitated N-i-P detector 802. Proton bombardment regions 162 isolate the N-i-P detector 802 from other devices on the semiconductor chip. The plurality of alternating cathode finger regions 836 and anode finger regions 838 are positioned between the primary cathode region 830 and the primary anode region 832. Thus, between each pair of an n-type region (i.e., either the primary cathode region 830 or one of the cathode finger regions 836) and an adjacent p-type region (i.e., either the primary anode region 832 or one of the anode fingers 838) an i region 834 is formed in the active multilayer stratum 118. In all other respects, the cathode regions 830 and 836, the anode regions 832 and 838 and the i regions 834 correspond in general shape and operation to the linear laterally oriented N-i-P detector 102 shown in FIG. 1B.

As shown in FIG. 8C, the primary cathode region 830, the i region 834 and the anode finger region 838 form a N-i-P detector 802 which is generally identical in structure and operation to the N-i-P detector 102 shown in FIG. 1B. Similarly, the n-type emitter and collector regions 840 and 842 and the p-type based channel region 834 are identical in structure and operation to those of the N-P-N transistor 104 shown in FIG. 1B.

Figure 9A:
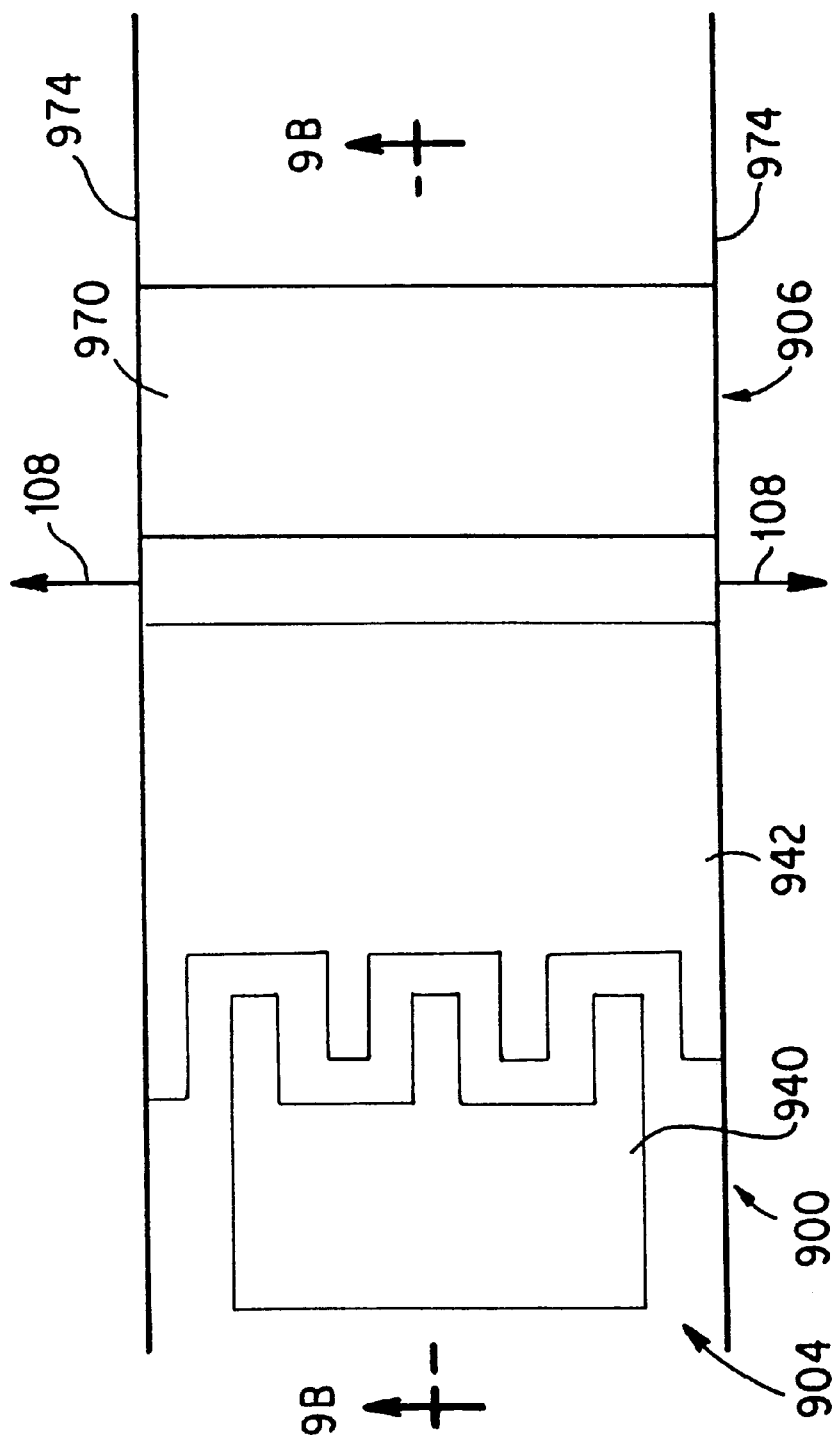
FIG. 9A is a second interdigitated N-P-N phototransistor integrated with an edge-emitting laser, where the middle n-type diffused region is common to the collector of the phototransistor and the cathode of the laser.

FIGS. 9A. an 9B show a ninth semiconductor device 900 comprising an interdigitated laterally oriented N-P-N phototransistor 904 physically integrated with an edge emitting laser 906. In particular, as shown in FIG. 9A, the interdigitated phototransistor 904 comprises an n-type emitter region 940 and a combined n-type transistor collector and laser cathode region 942. The edge emitting laser 906 comprises the n-type transistor collector and laser cathode region 942 and the laser anode region 970. Because the laser 906 is an edge emitting laser, the semiconductor device 900 has laser facets 974 formed in the semiconductor chip on either side of the laser 906. Thus, when the laser 906 lases, it emits a laser beam 108 from each of the laser facets 974.

Figure 9B:
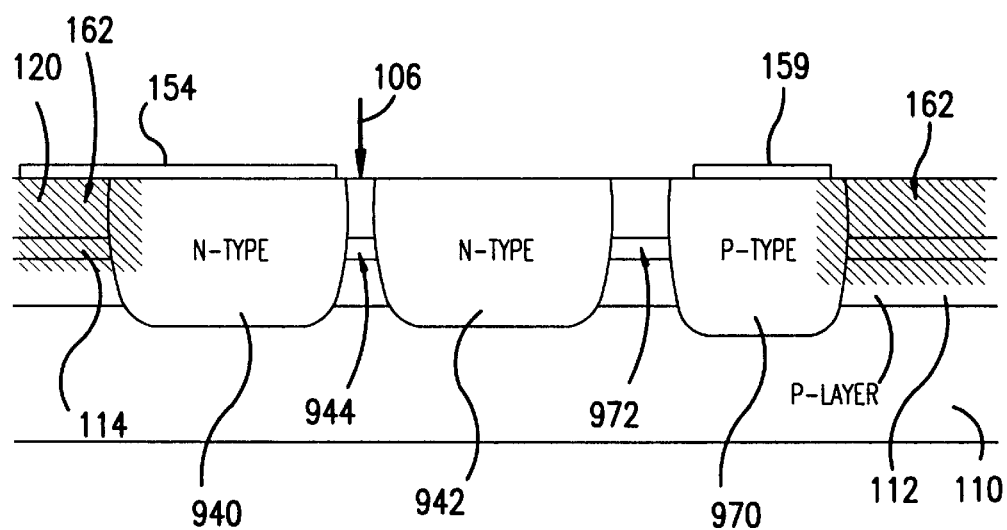
FIG. 9B is a cross-sectional view of the semiconductor device of FIG. 9A.

As shown in FIG. 9B, the semiconductor device 900 comprises a semi-insulating substrate 110. A p-type first cladding layer 112, which is identical to the first cladding layers 112 of the semiconductor devices 100–800, is formed over the semi-insulating substrate 110. Then, a buried p-type layer 114 is formed over the first cladding layer 112. Next, a second cladding layer 120, which is identical to the second cladding layers 120 of the semiconductor devices 100–800, is formed over the buried p-type layer 114. It should be appreciated that, because the semiconductor device 900 does not include a N-i-P detector or a P-i-N detector, the spacer layer 116 and the active multilayer stratum 118 can be omitted.

A first n-type region 940 is formed in the second cladding layer 120 and extends through the buried p-type layer 114 and the first cladding layer 112 and into the semi-insulating substrate 110. This first n-type layer 940 forms the emitter for the phototransistor 904. A second n-type region 942, which is also formed in the second cladding layer 120 and which extends through the buried p-type layer 114 and the first cladding layer 112, and into the semi-insulating substrate 110, forms both the collector for the phototransistor 904 and the cathode of the laser 906. A p-type region 970 forms the anode of the laser 906. The p-type region 970 is formed in the second cladding layer 120 and extends through the buried p-type layer 114 and the first cladding layer 112 and into the semi-insulating substrate 110.

The portion of the undisordered p-type layer 114 located between the n-type regions 940 and 942 forms the p-type base channel 944 of the phototransistor 904. The p-type base channel 944 must also be tuned to a particular wavelength of light to which the phototransistor is to react. Accordingly, the bandgap of the p-type base channel region 944 must be smaller than an energy of the wavelength(s) of light to which the phototransistor 904 is tuned.

Similarly, the portion of the undisordered p-type layer 914 located between the n-type transistor collector and laser cathode region 942 and the laser anode region 970 forms the laser waveguide region 972 of the edge emitting laser 906. A pair of proton bombardment regions 162 are formed on the outer sides of the semiconductor device 900 to isolate it from other semiconductor devices formed on the same semiconductor chip. It should also be appreciated that, for light of the proper wavelength(s) to reach the buried base channel region 944, it is necessary that the second cladding layer 120 be transparent to those wavelength(s) of light.

In operation, when light 106 of the proper wavelength(s) impinges on the photodetector 904, the light 106 passes through the transparent (to that wavelength) second cladding layer 120 and generates charge carriers in the p-type base channel region 944. This induces a current in the base channel region 944, thus turning on the N-P-N phototransistor 904. Because the n-type region 944 forms both the transistor collector and the layer cathode region, turning on the phototransistor 904 provides current to the edge emitting laser 906. As a result, as long as the phototransistor 904 is on, the laser 906 generates the laser beam 108.

Figure 10A:
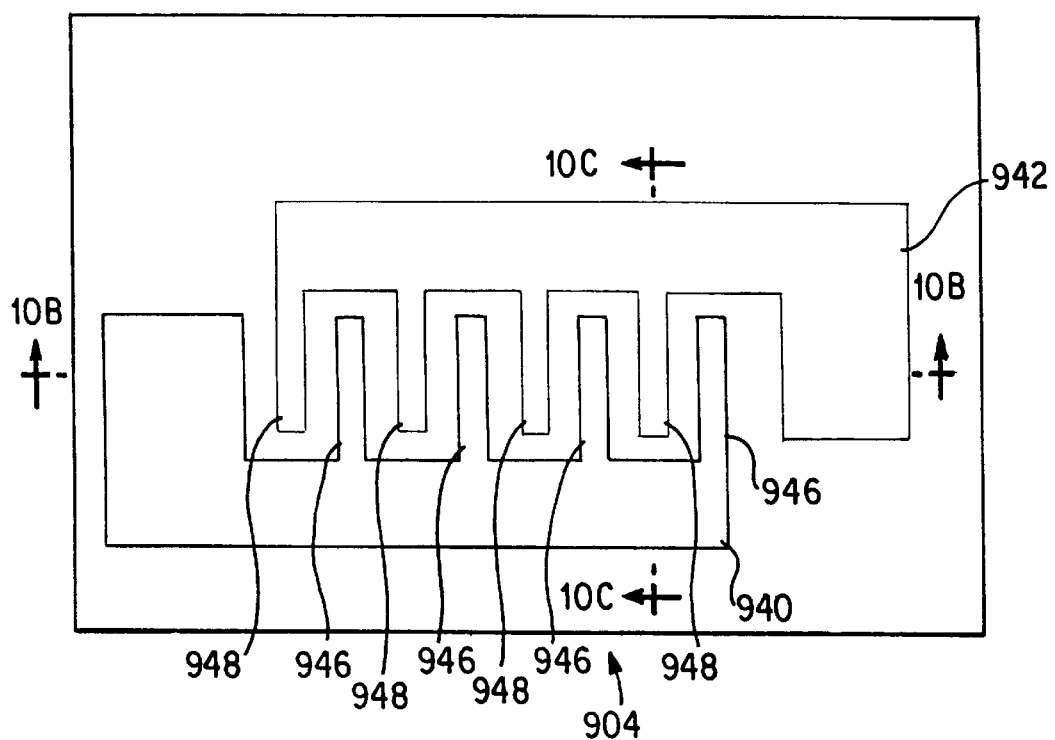
FIG. 10A is a top plan view of a third interdigitated phototransistor.
Figure 10C:
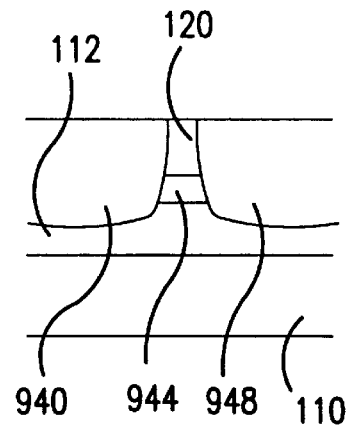
FIG. 10C is a second cross-sectional view of the semiconductor device of FIG. 10A.
Figure 10B:
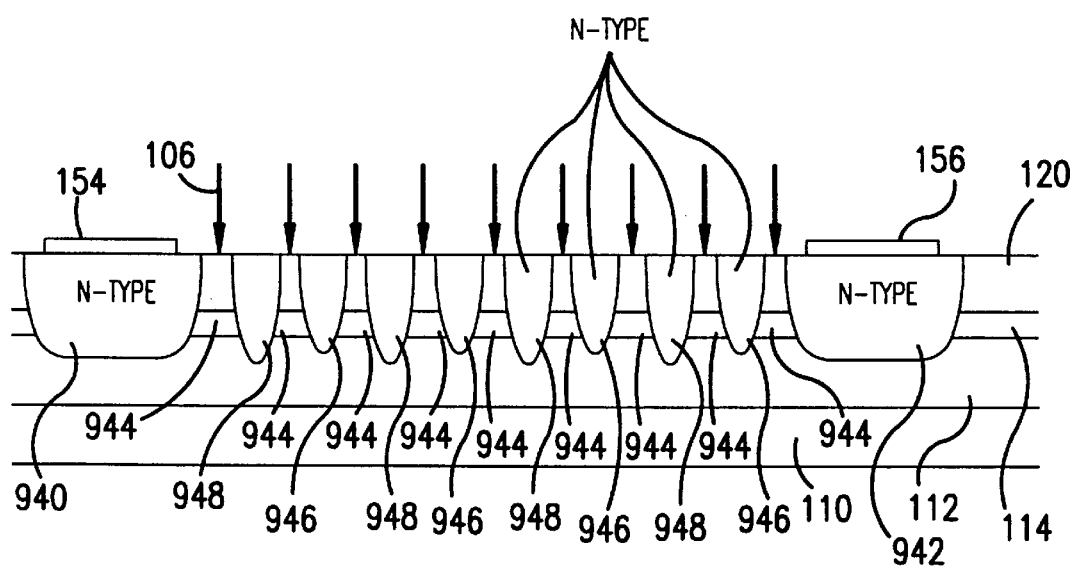
FIG. 10B is a cross-sectional view of the semiconductor device of FIG. 10A.

FIGS. 10A–10C show the interdigitated laterally oriented phototransistor 904 in greater detail and a different cross-sectional view. It should also be appreciated that while FIGS. 10A–10C show an N-P-N phototransistor 904, it is equally possible that the phototransistor 904 could be a P-N-P transistor. Thus, while the various regions 940, 942, 946 and 948 are described as n-type, these regions could also be p-type. Similarly, while the base channel regions 944 are described as p-type, it is equally possible they could be n-type.

FIG. 10A shows a top plan view of the phototransistor 904 showing greater detail than FIG. 9A. The shape of the interdigitated regions are slightly different in the two views since the phototransistor of FIG. 10A is not constrained by the laser facets 974 of device 900 in FIG. 9A. FIGS. 10B and 10C are side sectional views of the phototransistor 904 shown in FIG. 10A. In particular, the sectional views shown in FIGS. 10B and 10C are at 90° to each other.

As shown in FIG. 10A, each of the emitter and collector regions 940 and 942 have a plurality of interdigitated and alternating emitter or collector finger regions 946 and 948 extending from them, respectively. As shown in FIGS. 10B and 10C, a base channel region 944 is formed between each pair of adjacent n-type regions 940 and 948, 948 and 946, and 946 and 942.

Figure 11:
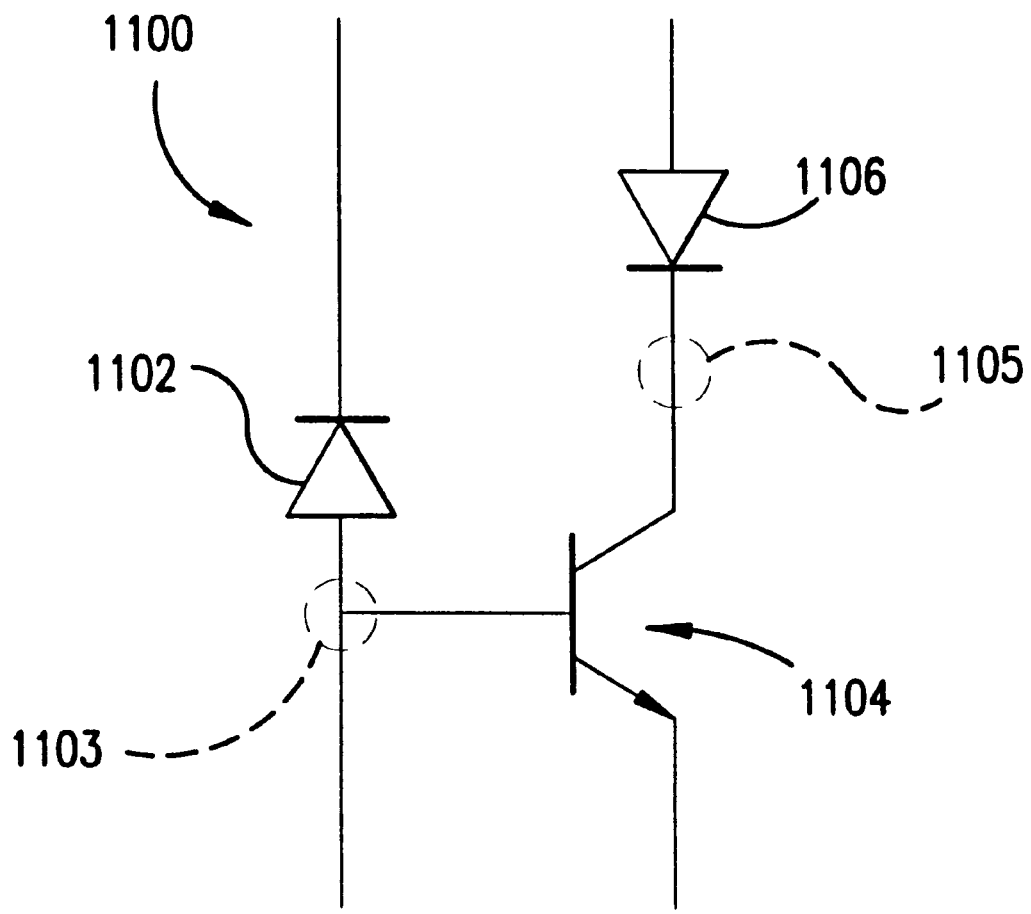
FIG. 11 is a circuit diagram of a laser diode integrated with an N-i-P detector and an N-P-N transistor.

FIG. 11 is a circuit diagram of a tenth semiconductor device 1100 comprising a laser diode 1106 integrated with a N-i-P detector 1102 and an N-P-N transistor 1104. The N-i-P detector 1102 can be interdigitated or linearly or circularly oriented, as described above with respect to FIGS. 1B–5B and 8A–8C. Similarly, the N-i-P detector can be laterally or vertically oriented, as described above with respect to FIGS. 1B–8C. Additionally, the transistor 1104 may be interdigitated or linearly or circularly oriented as described above with respect to FIGS. 1B–10B. Furthermore, the laser 1106 may be an edge emitting or surface emitting laser.

The N-i-P detector 1102 and the N-P-N transistor 1104 share a buried detector anode/base connection 1103. Similarly, the transistor 1104 and the laser 1106 share a common collector and laser cathode region 1105. Finally, it should be appreciated that while FIG. 11 shows a N-i-P detector 1102 and an N-P-N transistor 1104, the detector 1102 could easily be a P-i-N detector and the transistor 1104 could easily be a P-N-P transistor. In this case, the detector and transistor would share a buried detector cathode/base connection while the transistor and laser would share a common collector and laser anode region.

Figure 12:
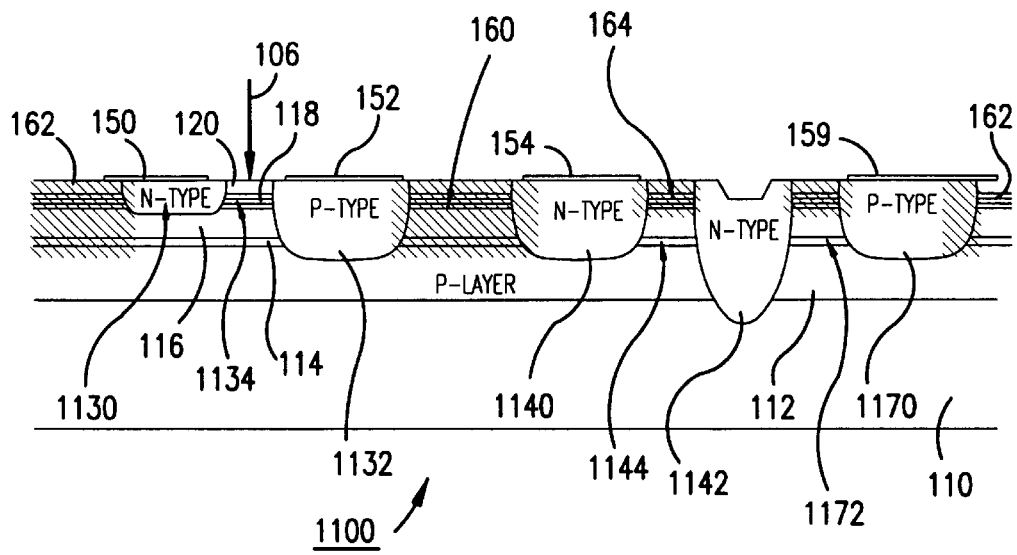
FIG. 12 is a side sectional view of a first embodiment of the semiconductor device of FIG. 11.
Figure 13:
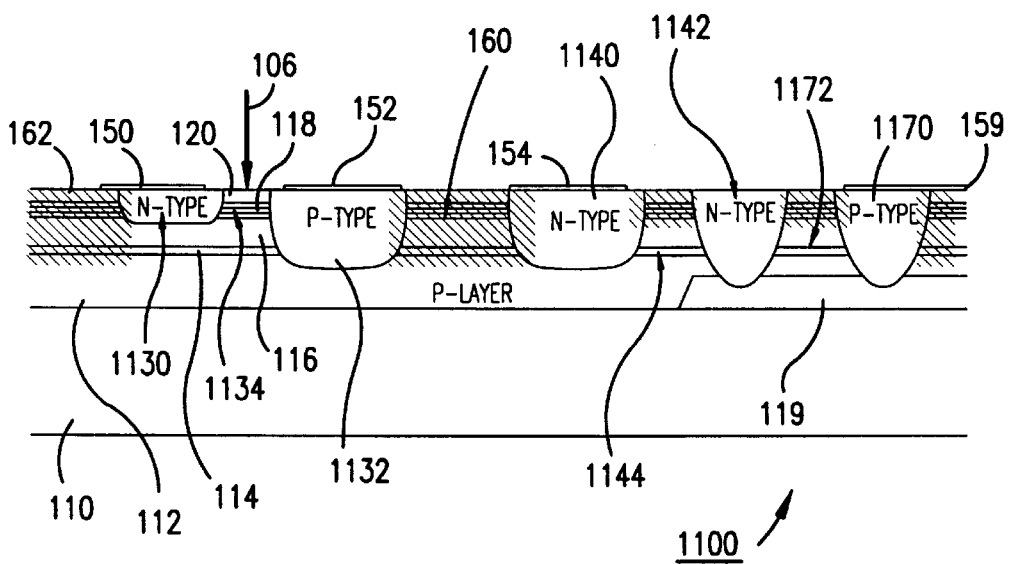
FIG. 13 is a side sectional view of a second embodiment of the semiconductor device of FIG. 11.

FIGS. 12 and 13 are side sectional views of two possible structures for integrating the P-i-N detector 1102, the N-P-N transistor 1104 and the laser diode 1106 into the single semiconductor device 1100. In general, the semiconductor devices 1100 shown in FIGS. 12 and 13 are identical to the semiconductor device 100 shown in FIG. 1, further including the laser anode region 970 and the laser waveguide region 972 of FIG. 9B.

However, because the laser waveguide region 1172 which is formed in the buried p-type layer 114 must be electrically isolated from the p-type base channel region 1144, also formed in the buried p-type layer 114, it is necessary to slightly alter the structure of the semiconductor device 1100 from the structure of the semiconductor devices 100 and 900. This isolation is provided by having the transistor collector and laser cathode region 1142 extend into a semi-insulating layer. As shown in FIG. 12, this is accomplished by having the n-type region 1142 extend not only into the first cladding layer 112 but through the first cladding layer 112 and into the semi-insulating substrate 110.

However, the p-type region 1132 and the n-type region 1140 cannot also be formed so that they extend through the first cladding layer 112 and into the semi-insulating substrate 110 because this would sever the electrical connection between the P-i-N detector 1102 and the N-P-N transistor 1104. To ensure the n-type region 1142 extends through the first cladding layer 112 and into the semi-insulating layer 110, but that the regions 1132 and 1140 do not extend into the semi-insulating layer 110 when they are grown, a notch is formed in the second cladding layer 120 where the n-type region 1142 is to be formed. The notch may extend into the active multilayer stratum 118. Because of the notch, when the regions 1132, 1140, 1142 and 1170 are formed, the n-type region 1142 will extend deeper into the substrate layers than the regions 1132, 1140 and 1170.

In contrast, in the structure of the semiconductor device 1100 shown in FIG. 13, rather than forming a notch in at least the second cladding of layer 120 where the n-type region 1142 is to be formed, before the semi-insulating layer 112 is formed, another undoped insulating or semi-insulating layer 119 is formed. This insulating or semi-insulating layer 119 is then etched back to form mesas that remain only under the portion of the semiconductor device 1100 where the n-type region 1142, and possibly where the p-type region 1170, will be formed. Thus, when the regions 1132, 1140, 1142 and 1170 are formed, regions 1142 and 1170 extend into the first cladding layer 112 and through the thinner portion of the first cladding layer 112 and into the insulating layer 119. Alternately the substrate can be etched to form these mesas, thereby eliminating growth of layer 119.

Because the remaining structures of the semiconductor devices 1100 shown in FIGS. 12 and 13 are identical to those shown in FIGS. 1B and 9B, no further description of these structures is necessary. Furthermore, it should be appreciated that, while FIGS. 12 and 13 show a linear laterally oriented N-i-P detector 1102 and a linear laterally oriented N-P-N transistor 1104, it is also possible to use circular laterally oriented N-i-P detectors, vertically oriented N-i-P detectors, linear laterally oriented P-i-N detectors, circular laterally oriented P-i-N detectors and vertically oriented P-i-N detectors. Likewise it is possible to use a linear laterally oriented P-N-P transistor in place of the linear laterally oriented N-P-N transistor 1104.

Figure 14A:
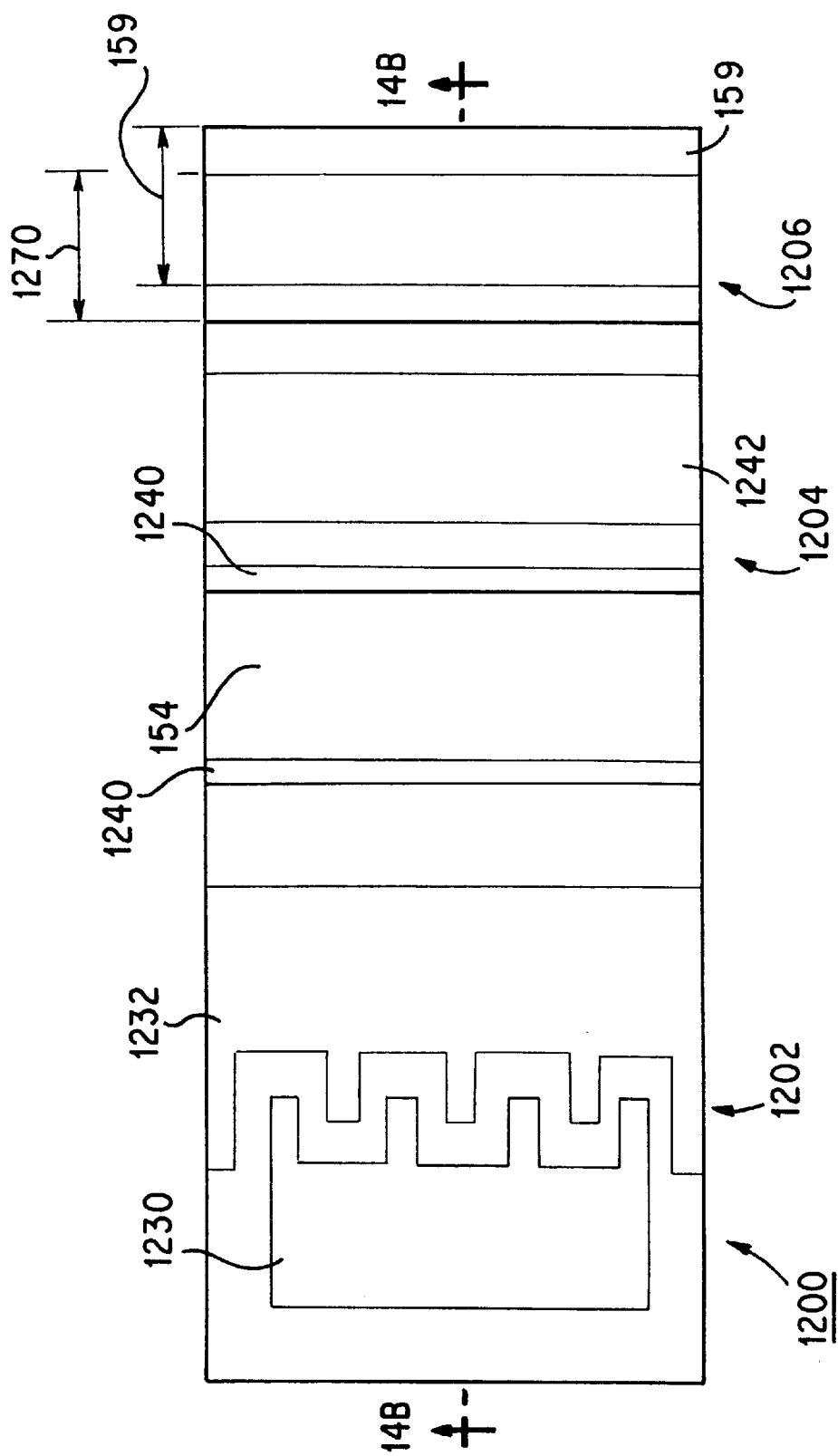
FIG. 14A is a top plan view of an interdigitated laterally oriented detector, a linear N-P-N transistor and an edge-emitting laser.
Figure 14B:
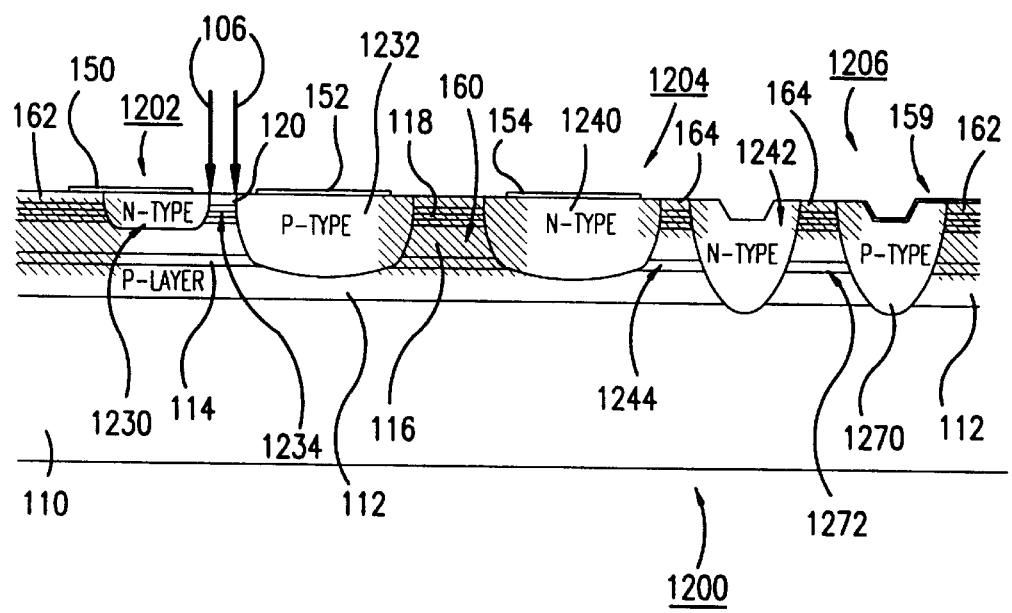
FIG. 14B is a cross-sectional view of the semiconductor device of FIG. 14A.

FIGS. 14A and 14B are a top planned view and a side sectional view of a eleventh semiconductor device 1200 comprising an interdigitated N-i-P detector 1202 and an N-P-N transistor 1204 integrated with an edge emitting laser 1206. In general, the interdigitated linear laterally oriented N-i-P detector 1202 is identical to the interdigitated linear laterally oriented N-i-P detector 802 shown in FIGS. 8A–8C. Similarly, the integrated linear laterally oriented N-P-N transistor 1204 and the integrated edge emitting laser 1206 are identical in structure and operation to the linear laterally oriented N-P-N transistor 1104 and integrated edge emitting laser 1106 shown in FIGS. 12 and 13. Thus, no further description of the structure and the operation of the twelfth semiconductor device 1200 is necessary.

However, it should be appreciated that, as shown in FIG. 14B, electrical isolation between the p-type channel region 1244 and the laser waveguide region 1272 can be provided by placing notches in the transparent second cladding layer 120, both at a location where the n-type combined transistor collector and laser cathode region 1242 will be formed and at a location where the p-type laser anode region 1270 will be formed. Thus, as shown in FIG. 14B, both the n-type region 1242 and the p-type region 1270 extend through the first cladding layer 112 and into the semi-insulating substrate 110.

Figure 15A:
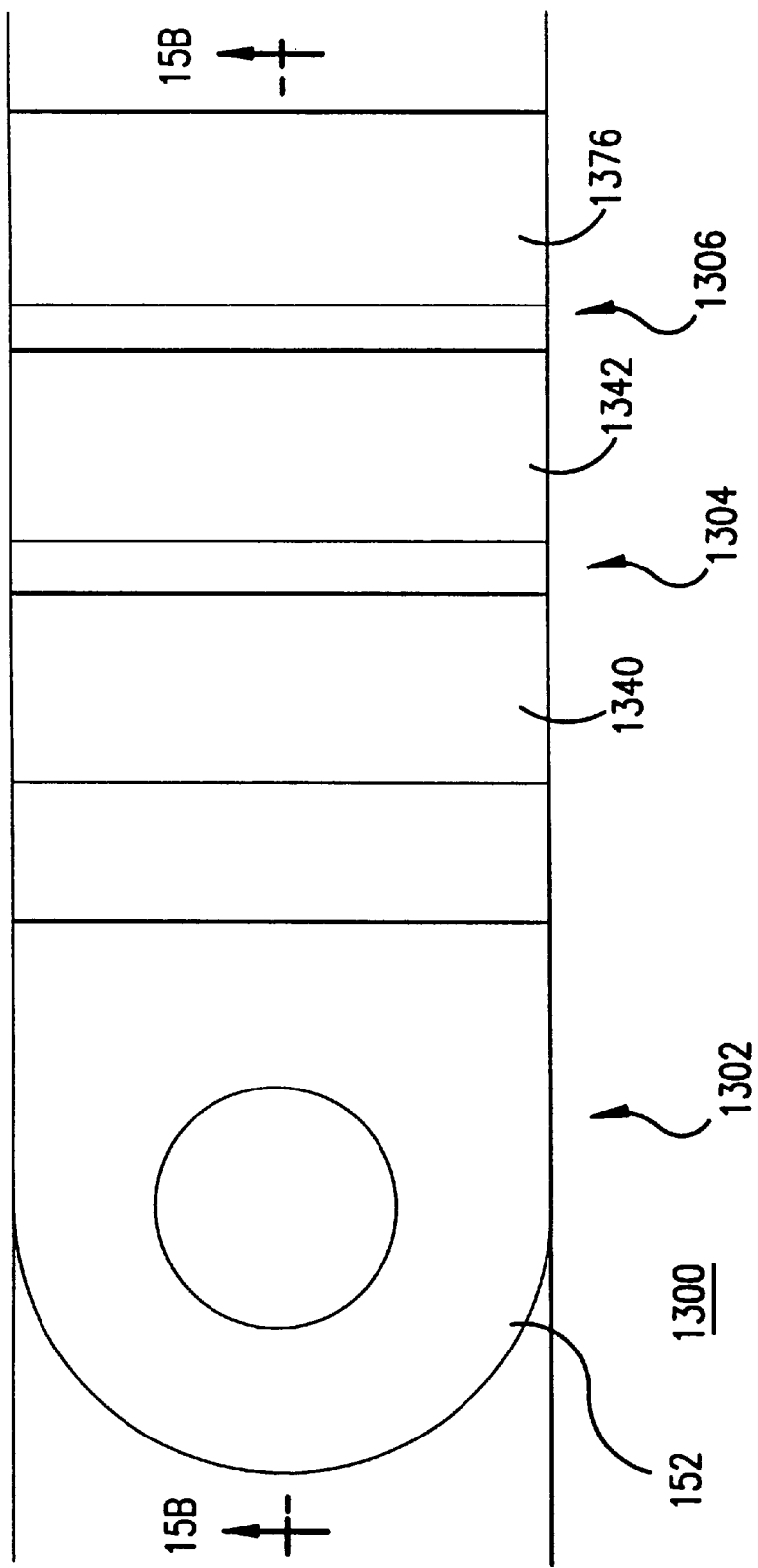
FIG. 15A is a top plan view of a semiconductor device including a circular vertically oriented P-i-N detector, a linear P-N-P transistor and an edge-emitting laser.
Figure 15B:
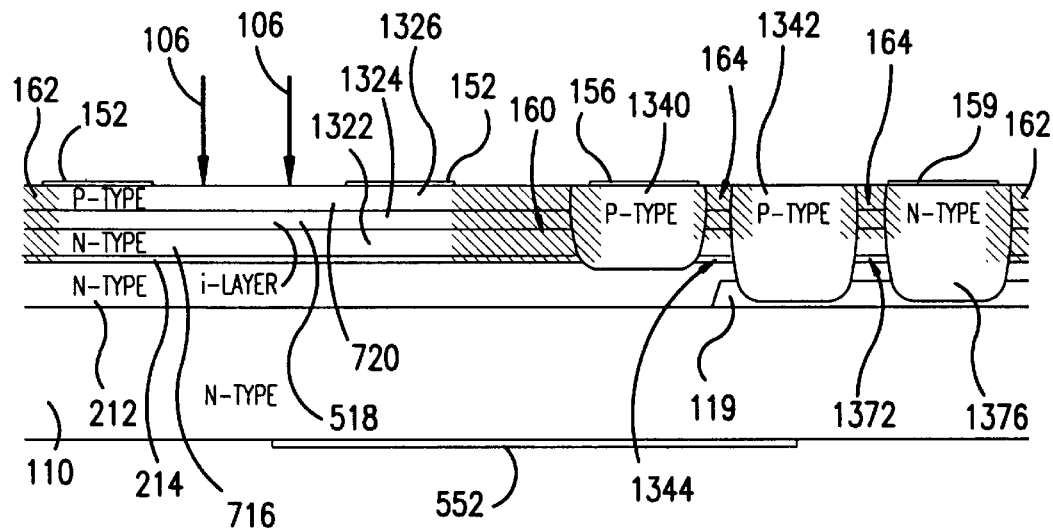
FIG. 15B is a cross-sectional view of the semiconductor device of FIG. 15A.

FIGS. 15A and 15B show a top plan view and a side sectional view of a twelfth semiconductor device 1300 comprising a vertically oriented P-i-N detector 1302 and a P-N-P transistor 1304 integrated with an edge emitting laser 1306. In general, as shown in FIG. 15B, the vertically oriented P-i-N detector 1302 is identical to the vertically oriented detector 702 shown in FIG. 7B. Similarly, the P-N-P detector 1304 is identical to the P-N-P transistor 204 shown in FIG. 2B.

As shown in FIG. 15B, the p-type region 1342 forms a single transistor collector and laser anode region, while the n-type region 1376 forms the cathode of the edge emitting laser 1306. In addition, as shown in FIG. 15B, the twelfth semiconductor device 1300 uses an n-type substrate and the substrate detector cathode and transistor base contact 552 of FIG. 5B rather than the remote detector anode region 708 of FIG. 7B. However, in all other respects, the structure and operation of the vertically oriented P-i-N detector 1302 is identical to the vertically oriented P-i-N detector 702.

Figure 16B:
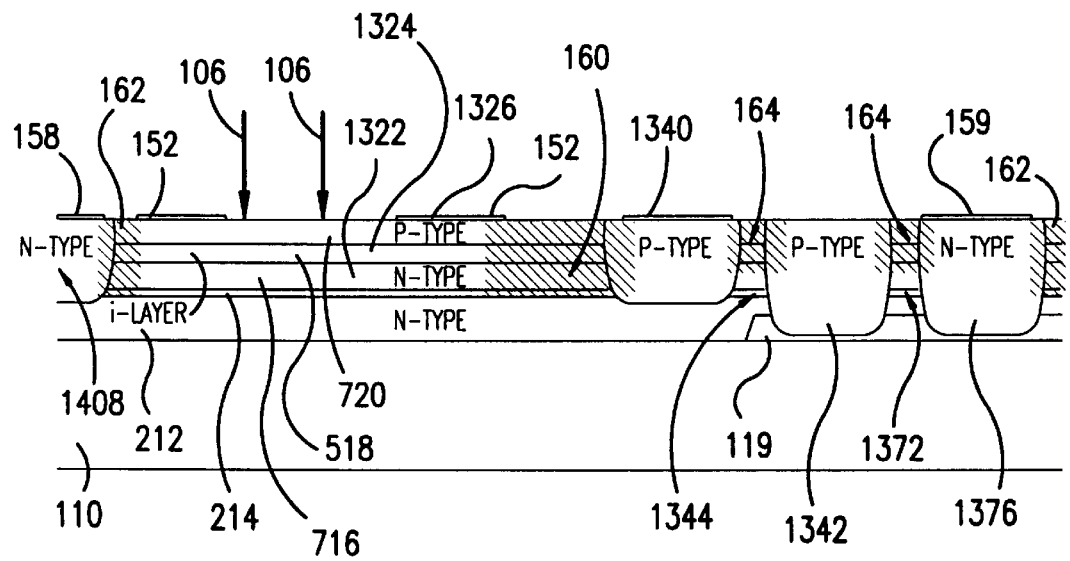
FIG. 16B is a cross-sectional view of the semiconductor device of FIG. 16A.
Figure 16A:
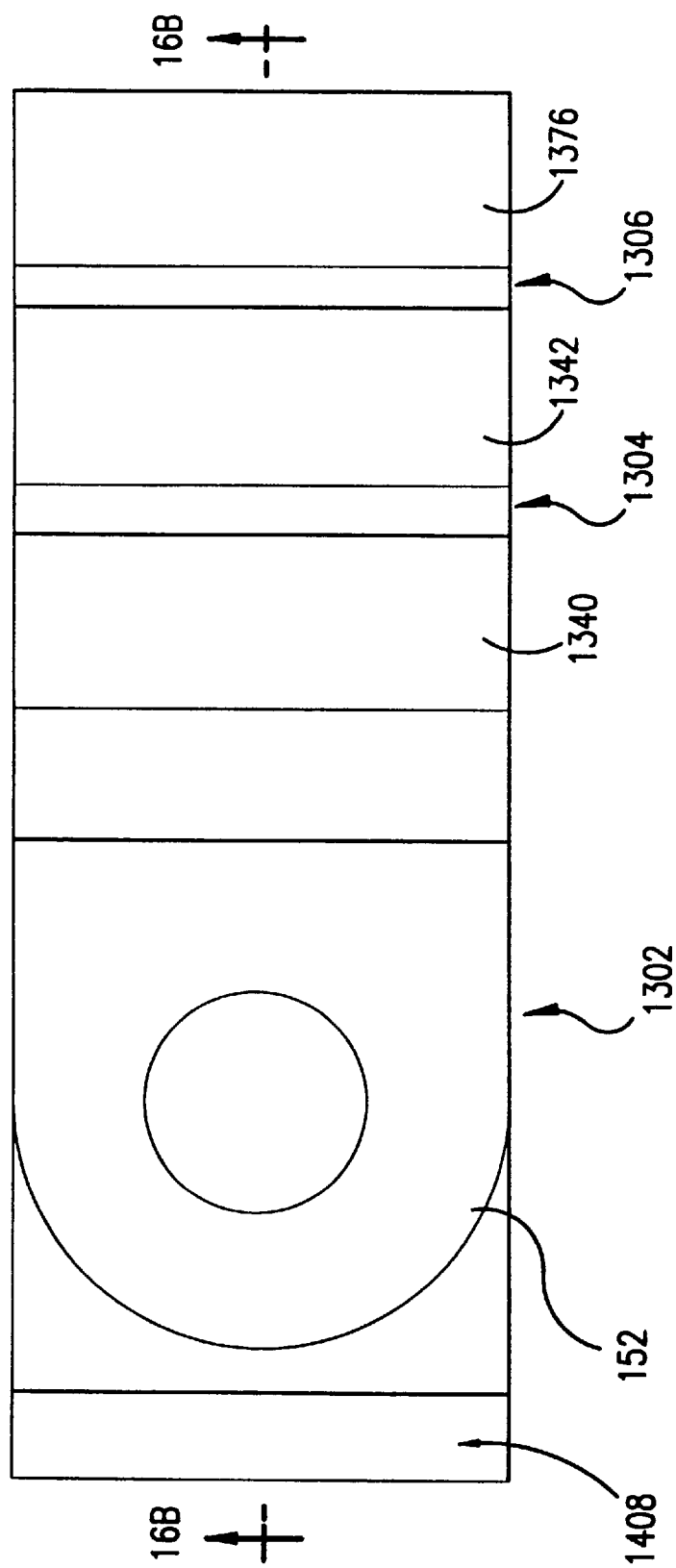
FIG. 16A is a top plan view of a semiconductor device including a circular vertically oriented P-i-N detector, a linearly oriented P-N-P transistor and an edge-emitting lasers.

FIGS. 16A and 16B show a thirteenth semiconductor device 1400 which is generally identical to the twelfth semiconductor device 1300. The thirteenth semiconductor device 1400 differs from the twelfth semiconductor device 1300 in that it uses an n-type detector cathode contact region 1408 in place of the substrate detector cathode contact 552 used in the twelfth semiconductor device 1300. In addition, the thirteenth semiconductor device 1400 is built on a p-type or semi-insulating substrate. In all other respects, the operation and the structure of the thirteenth semiconductor device 1400 is identical to the structure and operation of the twelfth semiconductor device 1300. Accordingly, no further description will be provided for the thirteenth semiconductor device 1400.

As noted above, other combinations with different geometric constructions are possible and contemplated by this invention. In addition, complementary embodiments using a P-N-P transistor are also contemplated by this invention. In the above structures, a buried layer provides the lateral region common to the base of the transistor in a terminal of the detector. A further diffused region forms a common region between the collector of the transistor and a terminal of the laser, which will preferably be a diode laser.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and the scope of the invention as defined in the following claims.

What is claimed is:

1. A semiconductor device, comprising:
   a substrate;
   a first cladding layer formed over the substrate;
   a semiconductive layer formed over the first cladding layer;
   a second cladding layer formed over the semiconductive layer;
   a bipolar phototransistor comprising:
      a first impurity induced layer disordered region,
      a second impurity induced layer disordered region,
      a base channel region formed from an undisordered portion of the semiconductive layer between the first and second impurity induced layer disordered regions;
   a diode laser integrated with the bipolar phototransistor comprising:
      a third impurity induced layer disordered region,
      an active waveguide region formed from an undisordered portion of the semiconductive layer between the second and third impurity induced layer disordered regions;
   wherein one of an anode region and a cathode region of the laser and one of a collector region and an emitter region of the bipolar phototransistor comprise the second impurity induced layer disordered region so as to provide current to the diode laser in response to light incident on the phototransistor.

2. A monolithically integrated semiconductor device, comprising:
   a semiconductor substrate;
   at least three semiconductor layers formed over the substrate;
   at least three separated regions formed by impurity induced layer disordering, comprising at least one p-type doped region and at least one n-type doped region;
   wherein the at least three separated regions form at least two optoelectronic devices that are electrically connected by at least one of the at least three semiconductor layers.

3. The semiconductor device of claim 2, wherein at least one of said optoelectronic devices is one of an edge-emitting diode laser, a surface-emitting diode laser, a photodetector, a bipolar transistor, and a phototransistor.

4. The semiconductor device of claim 2, wherein at least one of said optoelectronic devices is laterally interdigitated.

5. The semiconductor device of claim 2, wherein at least one of said optoelectronic devices are one of laterally oriented and vertically oriented.

6. The semiconductor device of claim 2, wherein at least one of said optoelectronic devices is one of linearly shaped, circularly shaped and semicircularly shaped.

7. A monolithically integrated semiconductor device, comprising:
   a semiconductor substrate;
   at least three semiconductor layers formed over the substrate;
   at least three separated regions formed by impurity induced layer disordering, comprising at least one p-type doped region and at least one n-type doped region;
   wherein the at least three separated regions form at least two optoelectronic devices and at least one of the impurity induced layer disordered regions is common to at least two of the optoelectronic devices.

8. The semiconductor device of claim 7, wherein at least one of the optoelectronic devices is one of an edge-emitting diode laser, a surface-emitting diode laser, a photodetector, a bipolar transistor, and a phototransistor.

9. The semiconductor device of claim 7, wherein at least one of said optoelectronic devices is laterally interdigitated.

10. The semiconductor device of claim 7, wherein at least one of said optoelectronic devices is one of laterally oriented and vertically oriented.

11. The semiconductor device of claim 7, wherein at least one of the optoelectronic devices is one of linearly shaped, circularly shaped and semicircularly shaped.

12. The semiconductor device according to claim 1, wherein the first, second and third impurity induced disordered regions extend into the substrate.

13. The semiconductor device according to claim 1, wherein the base channel region is tuned to receive light of a predetermined wavelength.

14. An optical communication link, comprising:
   a light source that emits light at an optical wavelength; and
   a semiconductor device according to claim 1,
   wherein the energy bandgap of the semiconductive layer in the base channel region is less than the energy of the wavelength of the light emitted by the light source.

15. The optical communication link of claim 14, wherein the light source emits light with intensity varying in accordance with an information signal, and the intensity variations in the light are substantially reproduced by the variations in the intensity of light emitted by the diode laser in response to current produced by the phototransistor.

* * * * *

UNITED STATES PATENT AND TRADEMARK OFFICE
CERTIFICATE OF CORRECTION

PATENT NO.       : 6,002,142                                              Page 1 of 1
APPLICATION NO.  : 08/724620
DATED            : December 14, 1999
INVENTOR(S)      : Thomas L. Paoli It is certified that error appears in the above-identified patent and that said Letters Patent is hereby corrected as shown below:

Column 1, line 5, insert as a new paragraph:

This invention was made with Government support under Agreement No. N00014-82-C-0244 awarded by the Office of Naval Research. The Government has certain rights in this invention.

Signed and Sealed this

Eleventh Day of July, 2006

JON W. DUDAS
*Director of the United States Patent and Trademark Office*

UNITED STATES PATENT AND TRADEMARK OFFICE
CERTIFICATE OF CORRECTION

PATENT NO.         : 6,002,142                                      Page 1 of 1
APPLICATION NO. : 08/724620
DATED              : December 14, 1999
INVENTOR(S)        : Thomas L. Paoli It is certified that error appears in the above-identified patent and that said Letters Patent is hereby corrected as shown below:

Column 1, line 5, insert as a new paragraph:

--This invention was made with Government support under Agreement No. N00014-92-C-0009 awarded by the Office of Naval Research. The Government has certain rights in this invention.--

This certificate supersedes the Certificate of Correction issued July 11, 2006.

Signed and Sealed this

Twenty-sixth Day of January, 2010

David J. Kappos
*Director of the United States Patent and Trademark Office*